(12) United States Patent
Hsu et al.

(10) Patent No.: US 11,586,114 B2
(45) Date of Patent: Feb. 21, 2023

(54) WAVEFRONT OPTIMIZATION FOR TUNING SCANNER BASED ON PERFORMANCE MATCHING

(71) Applicant: ASML NETHERLANDS B.V., Veldhoven (NL)

(72) Inventors: Duan-Fu Stephen Hsu, Fremont, CA (US); Christoph Rene Konrad Cebulla Hennerkes, Felton, CA (US); Rafael C. Howell, Santa Clara, CA (US); Zhan Shi, San Jose, CA (US); Xiaoyang Jason Li, Mountain View, CA (US); Frank Staals, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/973,377

(22) PCT Filed: Jun. 21, 2019

(86) PCT No.: PCT/EP2019/066446
§ 371 (c)(1),
(2) Date: Dec. 8, 2020

(87) PCT Pub. No.: WO2020/002143
PCT Pub. Date: Jan. 2, 2020

(65) Prior Publication Data
US 2021/0364929 A1    Nov. 25, 2021

Related U.S. Application Data

(60) Provisional application No. 62/861,673, filed on Jun. 14, 2019, provisional application No. 62/689,482, filed on Jun. 25, 2018.

(51) Int. Cl.
  *G03F 7/20*  (2006.01)
(52) U.S. Cl.
  CPC .......... *G03F 7/70266* (2013.01); *G03F 7/705* (2013.01); *G03F 7/7055* (2013.01)
(58) Field of Classification Search
  CPC ..... G03F 7/70266; G03F 7/705; G03F 7/7055
  See application file for complete search history.

(56) References Cited

U.S. PATENT DOCUMENTS

| 6,046,792 A | 4/2000 | Van Der Werf et al. |
| 6,961,116 B2 | 11/2005 | Den Boef et al. |

(Continued)

FOREIGN PATENT DOCUMENTS

| TW | 201633005 | 9/2016 |
| TW | 201708973 | 3/2017 |

(Continued)

OTHER PUBLICATIONS

International Search Report and Written Opinion issued in corresponding PCT Patent Application No. PCT/EP2019/066446, dated Oct. 22, 2019.

(Continued)

*Primary Examiner* — Deoram Persaud
(74) *Attorney, Agent, or Firm* — Pillsbury Winthrop Shaw Pittman LLP

(57) ABSTRACT

A method for determining a wavefront parameter of a patterning process. The method includes obtaining a reference performance (e.g., a contour, EPE, CD) of a reference apparatus (e.g., a scanner), a lens model for a patterning apparatus configured to convert a wavefront parameter of a wavefront to actuator movement, and a lens fingerprint of a tuning apparatus (e.g., a to-be-matched scanner). Further, the method involves determining the wavefront parameter (e.g., a wavefront parameter such as tilt, offset, etc.) based (Continued)

on the lens fingerprint of the tuning apparatus, the lens model, and a cost function, wherein the cost function is a difference between the reference performance and a tuning apparatus performance.

20 Claims, 23 Drawing Sheets

(56) References Cited

U.S. PATENT DOCUMENTS

| | | |
|---|---|---|
| 7,587,704 B2 | 9/2009 | Ye et al. |
| 11,126,092 B2* | 9/2021 | Cheong ............... G03F 7/70625 |
| 2006/0066855 A1 | 3/2006 | Boef et al. |
| 2009/0053628 A1 | 2/2009 | Ye et al. |
| 2009/0157360 A1 | 6/2009 | Ye et al. |
| 2009/0213349 A1 | 8/2009 | Renwick et al. |
| 2009/0300573 A1 | 12/2009 | Cao et al. |
| 2010/0125823 A1 | 5/2010 | Renwick et al. |
| 2010/0315614 A1 | 12/2010 | Hansen |
| 2011/0172804 A1 | 7/2011 | Park et al. |
| 2012/0008134 A1 | 1/2012 | Azpiroz et al. |
| 2012/0117521 A1 | 5/2012 | Feng et al. |
| 2012/0124529 A1 | 5/2012 | Feng et al. |
| 2012/0314196 A1 | 12/2012 | He et al. |
| 2014/0207271 A1 | 7/2014 | Tsai et al. |
| 2014/0264773 A1 | 9/2014 | Chang et al. |
| 2017/0315441 A1 | 11/2017 | Finders |
| 2018/0107120 A1 | 4/2018 | Swaenen et al. |
| 2019/0324371 A1* | 10/2019 | Van Der Logt ..... G03F 7/70641 |
| 2019/0361358 A1* | 11/2019 | Tel ........................... G06N 3/02 |
| 2020/0124989 A1* | 4/2020 | Ten Berge .......... G03F 7/70633 |
| 2021/0364929 A1* | 11/2021 | Hsu ..................... G03F 7/70525 |
| 2022/0260920 A1* | 8/2022 | Smorenberg ............ G03F 7/705 |

FOREIGN PATENT DOCUMENTS

| | | |
|---|---|---|
| WO | 2010059954 | 5/2010 |
| WO | 2018050432 | 3/2018 |

OTHER PUBLICATIONS

Taiwanese Office Action issued in corresponding Taiwanese Patent Application No. 108122129, dated Apr. 30, 2020.
He, Y. et. al.: "Simulation-based pattern matching using scanner metrology and design data to reduce reliance on CD metrology", Proc. of SPIE, vol. 7640 (2010).
Taiwanese Office Action issued in corresponding Taiwanese Patent Application No. 109140467, dated Dec. 9, 2021.

* cited by examiner

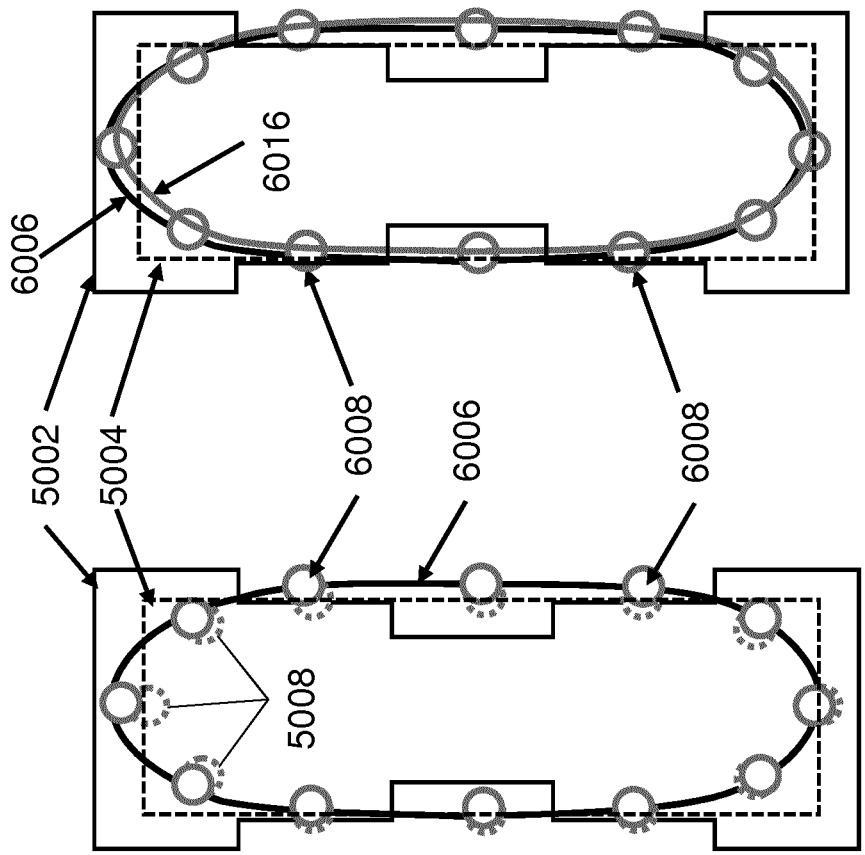
FIG. 6C
FIG. 6B
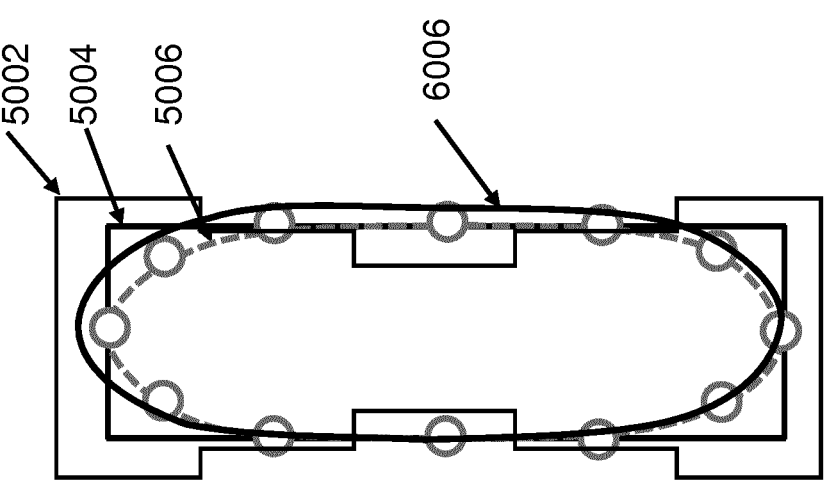
FIG. 6A

WAVEFRONT OPTIMIZATION FOR TUNING SCANNER BASED ON PERFORMANCE MATCHING

CROSS-REFERENCE TO RELATED APPLICATIONS

This application is the U.S. national phase entry of PCT Patent Application No. PCT/EP2019/066446, which was filed on Jun. 21, 2019, which claims the benefit of priority of U.S. Patent Application No. 62/689,482, which was filed on Jun. 25, 2018, and U.S. Patent Application No. 62/861,673 which was filed on Jun. 14, 2019, each of which is incorporated herein in its entirety by reference.

TECHNICAL FIELD

The description herein relates generally to apparatus and methods of an optimization process and determining optimum wavefront for a tuning scanner corresponding to a reference performance.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD = k_1 \times \lambda / NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

According to an embodiment, there is provided a method for determining a wavefront of a patterning apparatus of a patterning process. The method includes obtaining (i) a reference performance of a reference apparatus, (ii) a lens model of a patterning apparatus configured to convert a wavefront parameter of a wavefront to actuator movements, and (iii) a lens fingerprint of a tuning scanner, and determining, via a processor, the wavefront parameter based on the lens fingerprint of the tuning scanner, the lens model, and a cost function, wherein the cost function is a difference between the reference performance and a tuning scanner performance.

In an embodiment, the determining of the wavefront parameter is an iterative process. An iteration includes generating, via simulation of the lens model using the lens fingerprint of the tuning scanner, an initial wavefront, determining a substrate pattern from the initial wavefront, determining the tuning performance from the substrate pattern, evaluating the cost function based on the tuning performance and the reference performance, and adjusting the wavefront parameter of the initial wavefront based on a gradient of the cost function, such that the cost function is improved.

In an embodiment, the wavefront comprises the lens fingerprint of the tuning scanner and a performance fingerprint of the lens model.

In an embodiment, the adjusting of the wavefront parameter is further based on the performance fingerprint of the lens model.

In an embodiment, determining the substrate pattern comprises simulation of a process model of the patterning process using the initial wavefront or the adjusted wavefront.

In an embodiment, the process model includes a mask model configured to predict a mask image based from a mask pattern, an optical model configured to predict an aerial image from the mask pattern, and/or a resist model configured to predict a resist image from the aerial image.

In an embodiment, determining the substrate pattern includes receiving, via a metrology tool, substrate measurements of an exposed substrate, wherein the substrate is exposed using the initial wavefront or the adjusted wavefront; and determining the substrate pattern based on contour extraction from the substrate measurement.

In an embodiment, the cost function is minimized or maximized.

In an embodiment, the cost function is an edge placement error, CD and/or an error within a tolerance band of edge placement.

In an embodiment, the lens model includes constraints related to a correction limitation of a tuning scanner corresponding to a wavefront parameter.

In an embodiment, the wavefront parameter comprises an offset, a tilt and/or a curvature of an optical system of the patterning apparatus.

In an embodiment, the wavefront is a through-slit wavefront.

In an embodiment, the slit has a rectangular shape.

In an embodiment, the wavefront is represented by Zernike polynomial across a slit.

In an embodiment, the wavefront parameter is expressed as a vector of Zernike coefficients.

In an embodiment, the method further includes converting, via the lens model, the wavefront parameters to the actuator movements, and actuating the optical system of the tuning scanner based on the actuator movements.

In an embodiment, the reference performance and the tuning scanner performance are expressed in terms of a contour of a pattern and/or a critical dimension.

According to an embodiment, there is provided a method for determining a wavefront of a tuning scanner with respect to a reference apparatus. The method includes obtaining (i) a reference performance of the reference apparatus corresponding to a reference lens fingerprint, and (ii) a lens fingerprint of a tuning scanner; determining, via a processor, a wavefront parameter of the tuning scanner based on the lens fingerprint and a cost function, wherein the cost function computes a difference between the reference performance and a tuning scanner performance.

In an embodiment, obtaining the reference performance includes measuring the reference lens fingerprint of the reference apparatus; generating, via simulation of a process model, a reference pattern based on the measured lens fingerprint of the reference apparatus and a patterning device pattern corresponding to a design layout; and determining the reference performance based on a contour of the reference pattern.

In an embodiment, the determining of the wavefront parameter is an iterative process. An iteration includes determining via simulation of the process model, a substrate pattern using a patterning device pattern and a lens fingerprint of the tuning scanner; determining the tuning scanner performance based on the substrate pattern; evaluating the cost function based on the tuning scanner performance and the reference performance; and adjusting the wavefront parameter based on a gradient of the cost function with respect to the wavefront parameter, such that the cost function is improved.

In an embodiment, the patterning device pattern is generated via simulation of a mask optimization or source mask optimization process, wherein a lens aberration model is included in the process model.

In an embodiment, the reference performance and tuning scanner performance is expressed in terms of a contour of a pattern, and/or a critical dimension.

In an embodiment, the reference apparatus includes a scanner of a wafer fabrication facility, an ideal scanner having no aberrations, and/or an aberration compensated scanner that is compensated for average aberration of a plurality of scanners within the wafer fabrication facility.

In an embodiment, the cost function is an edge placement error, CD and/or an error within a tolerance band of edge placement.

In an embodiment, the wavefront parameter comprises an offset, a tilt, a curvature, and/or and up to and including third order parameters associated with an optical system of the patterning apparatus.

Furthermore, according to an embodiment, there is provided a method of wavefront matching of a tuning scanner for a patterning process. The method includes obtaining (i) a plurality of hot spot patterns corresponding to a layer of a substrate, (ii) a plurality of wavefronts corresponding to the plurality of hot spot patterns, and (iii) a lens fingerprint of a tuning scanner; determining, via simulation of a patterning process using the lens fingerprint, a tuning scanner performance; and selecting a wavefront parameter for the tuning scanner from the plurality of wavefronts based on comparison between the tuning scanner performance and a reference performance.

In an embodiment, one or more of the plurality of wavefronts include optimized wavefront parameters.

In an embodiment, the one or more of the plurality of wavefronts is associated with a particular reference performance.

Furthermore, according to an embodiment, there is provided a method of determining a lens adjustment parameter value for a patterning apparatus used in a patterning process. The method involves obtaining (i) a pupil weight map associated with an exposure wavefront, where weights of the pupil weight map are associated with a performance metric of the patterning apparatus, and (ii) a lens model of a patterning apparatus, the lens model configured to convert an aberration wavefront parameter associated with the exposure wavefront to a lens adjustment parameter; determining, via executing the lens model using the pupil weight map and the exposure wavefront, a lens adjustment parameter value such that a lens model merit function associated with the lens model is improved, where the lens model merit function is a function of the pupil weight map; and adjusting, via simulating a patterning process using the aberration wavefront associated with the lens adjustment parameter value, the weights of the pupil weight map such that the performance metric of the patterning process is improved, the performance metric being a function of an edge placement error and a pattern placement error associated with a pattern to be printed on a substrate.

Furthermore, according to an embodiment, there is provided a method of determining lens actuator setting for a patterning apparatus. The method includes obtaining a lens merit function and a reference value (e.g., an non-zero integer) assigned to a residual aberration wavefront associated with the patterning apparatus; and determining, via a lens model of the patterning apparatus using the lens merit function and the reference value, the lens actuator setting from the lens actuator space of the patterning apparatus based on minimizing the lens merit function, the lens merit function comprising a lithographic metric associated with the residual aberration wavefront.

BRIEF DESCRIPTION OF THE DRAWINGS

Embodiments will now be described, by way of example only, with reference to the accompanying drawings in which:

FIG. 6A illustrates an example of a reference contour as a matching target overlapping with the ideal contour of FIG. 5, according to an embodiment;

FIG. 6B illustrates an example of evaluation points on the reference contour of FIG. 6A, according to an embodiment;

FIG. 6C illustrates an example of tuning performance matching with the reference contour as a matching target of FIG. 6B, according to an embodiment;

DETAILED DESCRIPTION

Before describing embodiments in detail, it is instructive to present an example environment in which embodiments may be implemented.

Figure 1:
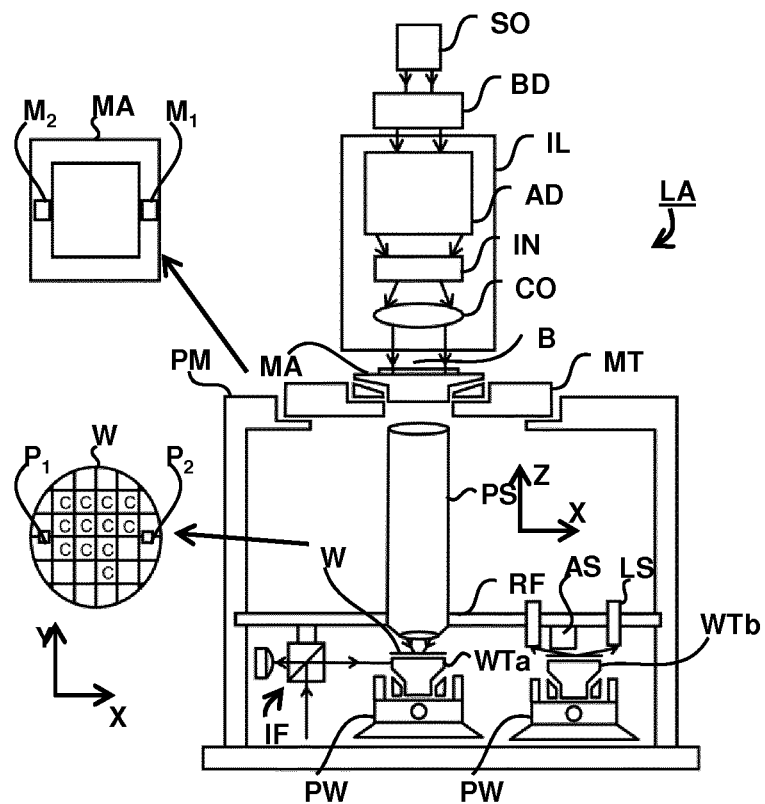
FIG. 1 schematically depicts a lithography apparatus, according to an embodiment.

FIG. 1 schematically depicts an embodiment of a lithographic apparatus LA. The apparatus comprises:

- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT (e.g., WTa, WTb or both) constructed to hold a substrate (e.g. a resist coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies and often referred to as fields) of the substrate W, the projection system supported on a reference frame (RF).

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

So, the illuminator IL may comprise adjuster AD configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

So, in operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that all the patterns are not defective.

Figure 2:
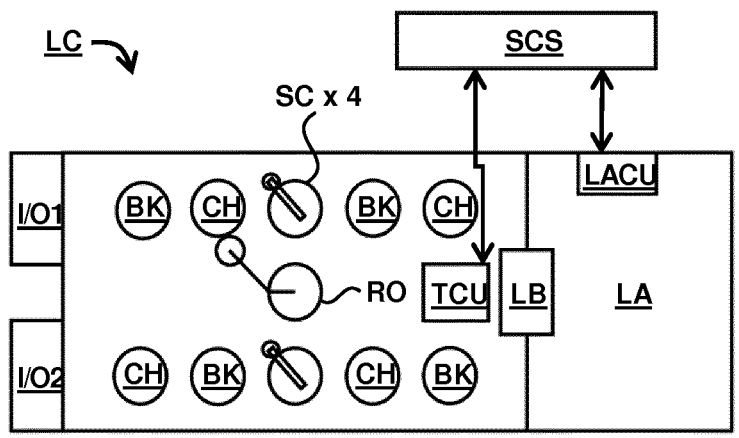
FIG. 2 schematically depicts an embodiment of a lithographic cell or cluster, according to an embodiment.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly a manufacturing facility in which lithocell LC is located also typically includes a metrology system MET which measures some or all of the substrates W that have been processed in the lithocell or other objects in the lithocell. The metrology system MET may be part of the lithocell LC, for example it may be part of the lithographic apparatus LA (such as alignment sensor AS).

The one or more measured parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching or can be performed after-etch.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and +1st orders in the diffraction spectrum of a periodic grating). This can be done as described above and as described, for example, in U.S. patent application publication US 2006-066855, which is incorporated herein in its entirety by reference. Another application of diffraction-based metrology is in the measurement of feature width (CD) within a target. Such techniques can use the apparatus and methods described hereafter.

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as ASML YieldStar metrology tool, ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias may alternatively be etched into the substrate (e.g., into one or more layers on the substrate).

The fabrication process (e.g., FIG. 2) includes more than one scanner (i.e., a lithographic apparatus) exhibiting different performances (e.g., in terms of patterns printed on a substrate). To provide consistent performance (e.g., consistent contour or CD) between different scanners or with respect to a reference performance, a wavefront optimization may be performed according to methods of the present disclosure.

In an embodiment, an optimization can be performed using, for example, an objective function, such as $$CF(z_1, z_2, \ldots, z_N) = \sum_{p=1}^{P} w_p f_p^2(z_1, z_2, \ldots, z_N) \quad (1)$$

wherein $(z_1, z_2, \ldots, z_N)$ are N design variables or values thereof; $f_p(z_1, z_2, \ldots, z_N)$ may be a function of a difference between an actual value and an intended value of a characteristic at the p-th evaluation point for a set of values of the design variables of $(z_1, z_2, \ldots, z_N)$. $w_p$ is a weight constant assigned to the p-th evaluation point. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, or any point on a patterning device pattern, or resist image, or aerial image.

The objective function may represent any suitable characteristics of the patterning process, such as of the lithographic projection apparatus or the substrate, for instance, focus, CD, image shift, image distortion, image rotation, etc. For example, the objective function may be a function of one or more of the following lithographic metrics: edge placement error, critical dimension, resist contour distance, worst defect size, pattern shift, stochastic effect, three-dimensional effect of the patterning device, three-dimensional effect of the resist, best focus shift, pupil fill factor, exposure time, and/or throughput. Since it is the resist image that often dictates the pattern on a substrate, the objective function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the wavefront.

The lithographic apparatus may include one or more components collectively called a "wavefront manipulator" that can be used to adjust shapes of a wavefront, intensity distribution, and/or phase shift of the radiation beam. The wavefront can be adjusted at any location along an optical path of the lithographic projection apparatus, such as before the patterning device, near a pupil plane, near an image plane, or near a focal plane. The projection optics can be used to correct or compensate for certain distortions of the wavefront caused by, for example, the illumination, the patterning device, temperature variation in the lithographic projection apparatus, and/or thermal expansion of components of the lithographic projection apparatus. Adjusting the wavefront can change values of the evaluation points and the objective function. Such changes can be simulated from a model or actually measured.

It should be noted that the normal weighted root mean square (RMS) of $f_p(z_1, z_2, \ldots, z_N)$ is defined as $$\sqrt{\frac{1}{P}\sum_{p=1}^{P} w_p f_p^2(z_1, z_2, \ldots, z_N)},$$

therefore, for example, minimizing the weighted RMS of $f_p(z_1, z_2, \ldots, z_N)$ is equivalent to minimizing the objective function $$CF(z_1, z_2, \ldots, z_N) = \sum_{p=1}^{P} w_p f_p^2(z_1, z_2, \ldots, z_N),$$

defined in Eq. 1. Thus the weighted RMS of $f_p(z_1, z_2, \ldots, z_N)$ and Eq. 1 may be utilized interchangeably for notational simplicity herein.

The optimization process is to find a set of values of the design variables, under the constraints $(z_1, z_2, \ldots, z_N) \in Z$, that, e.g., minimize the objective function, i.e., to find $$(\tilde{z}_1, \tilde{z}_2, \ldots, \tilde{z}_N) = \arg\min_{(z_1, z_2, \ldots, z_N) \in Z} CF(z_1, z_2, \ldots, z_N) = \quad (2)$$

$$\arg\min_{(z_1, z_2, \ldots, z_N) \in Z} \sum_{p=1}^{P} w_p f_p^2(z_1, z_2, \ldots, z_N)$$

The optimization does not necessarily lead to a single set of values for the design variables (e.g., wavefront parameters). In addition, there may be physical restraints caused by factors such as the pupil fill factor, the resist chemistry, the throughput, etc. The optimization may provide multiple sets of values for the design variables and associated performance characteristics (e.g., the throughput) and allows a user of the lithographic apparatus to pick one or more sets.

In an embodiment, an algorithm, such as the Gauss-Newton algorithm, the Levenberg-Marquardt algorithm, the gradient descent algorithm, simulated annealing, the genetic algorithm, etc. can be applied to evaluate and solve the objective function.

Figure 3:
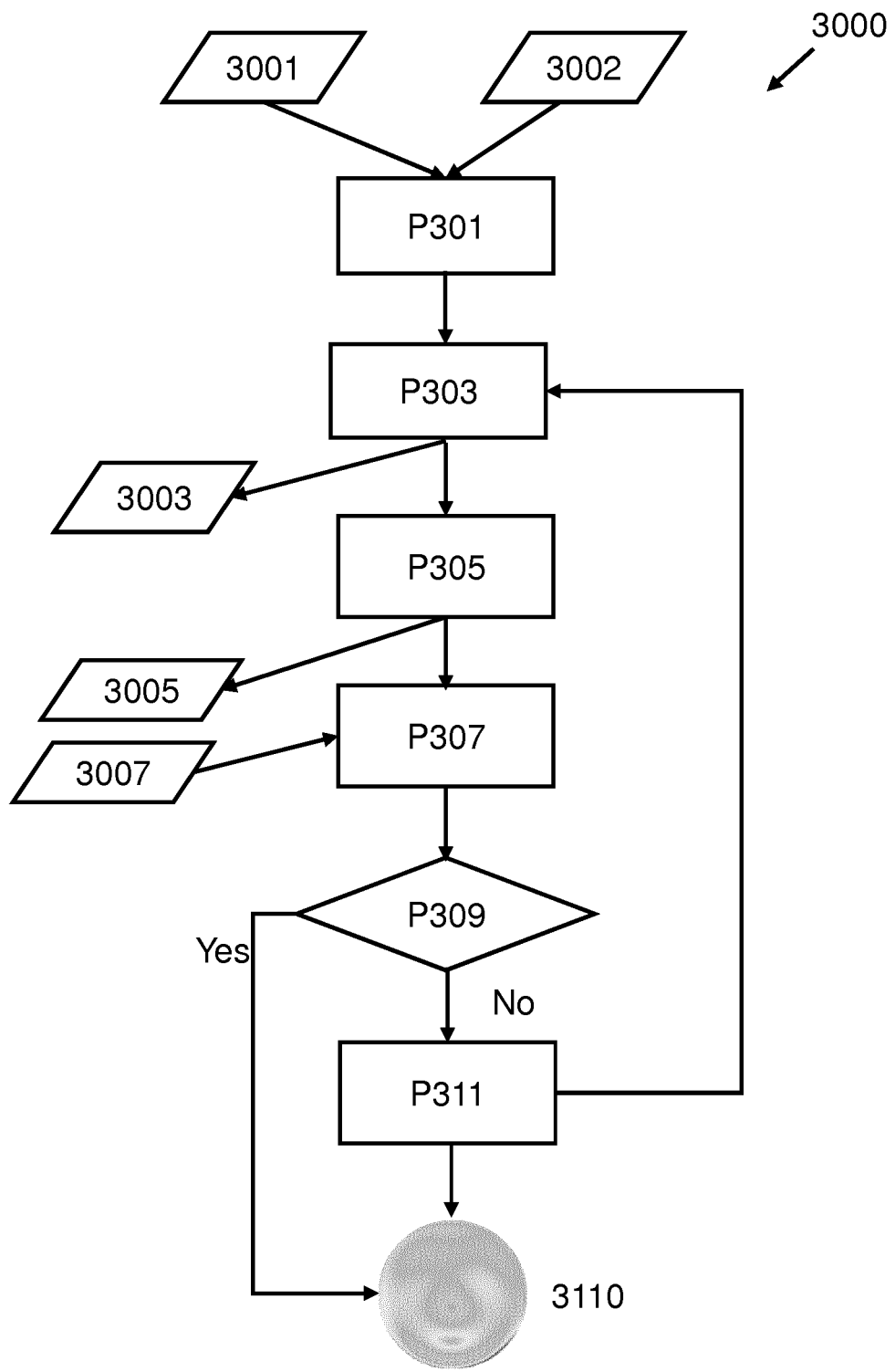
FIG. 3 is a flow chart of a method for wavefront optimization based on a lens model, according to an embodiment.
Figure 8:
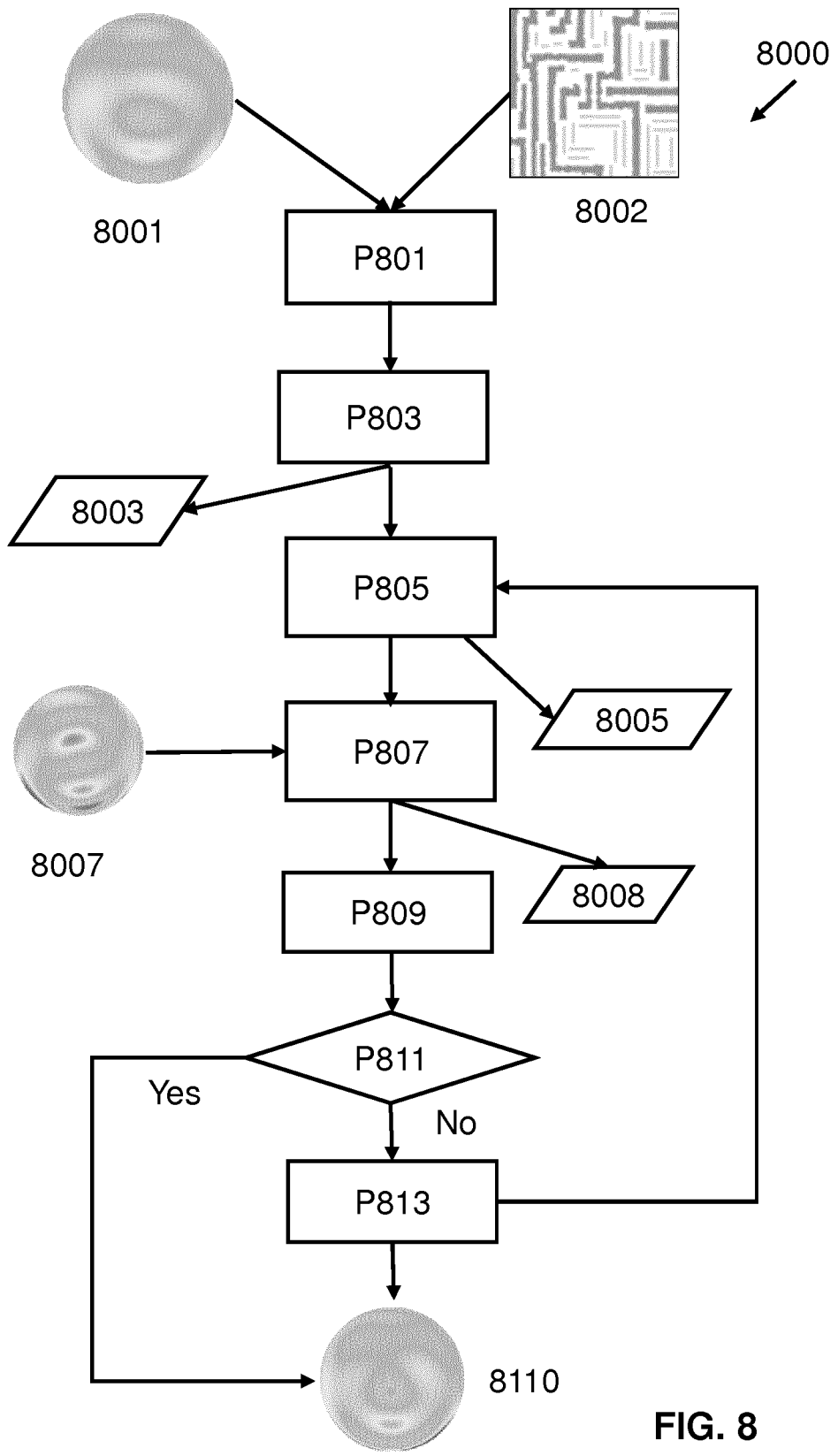
FIG. 8 is a flow chart of another method for wavefront optimization based on a reference scanner performance, according to an embodiment.
Figure 9:
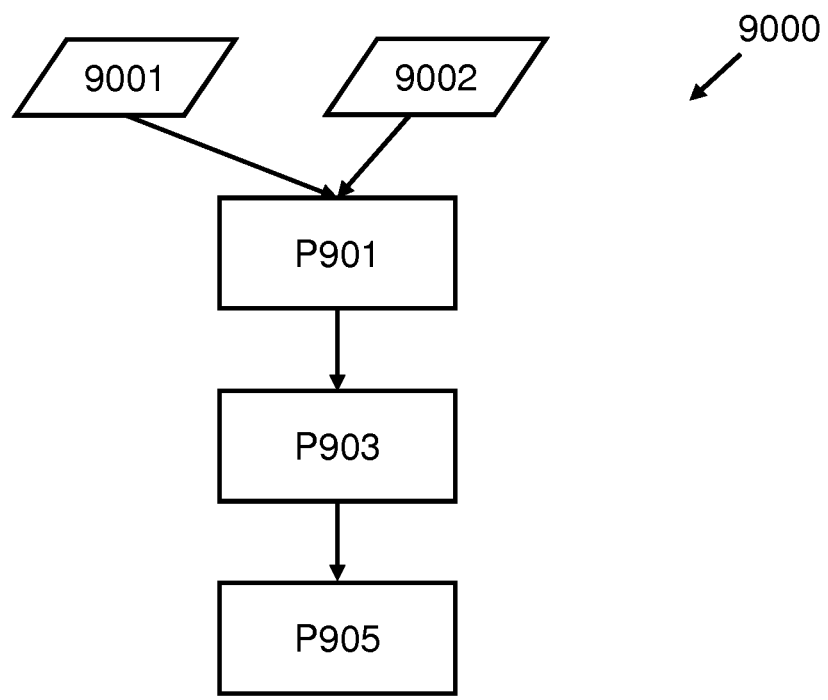
FIG. 9 is a flow chart of a method for determining wavefront for the tuning scanner based hot spot patterns, according an embodiment.

According to present disclosure, FIGS. 3, 8 and 9 illustrate flow charts of methods for wavefront determination of a tuning scanner. A tuning scanner or a tuning apparatus refers to any apparatus of a patterning process whose wavefront is adjusted such that a performance of the tuning apparatus closely matches a reference performance (e.g., more than 90% contour-to-contour matching). In an embodiment, the tuning scanner may be referred as a to-be-matched scanner. In an embodiment, the wavefront determination is an iterative process (also referred as wavefront optimization process), where the wavefront of the tuning scanner is progressively modified until a tuning performance (i.e., the performance of the tuning scanner) closely matches the reference performance. In an embodiment, the wavefront is a through-slit wavefront (e.g., a wavefront generated when light is projected across a rectangular slit).

In the present disclosure, a wavefront may be interchangeably referred as wavefront parameters, which define the wavefront. For example, the wavefront parameters may be Zernike coefficients, when the wavefront is represented by Zernike polynomial. Although Zernike polynomials are used by way of example to represent a wavefront, it does not limit the scope of the invention and any other model or representation may be used to represent a wavefront.

FIG. 3 is a flow chart of a method 3000 for determining a wavefront at a location across a slit of a tuning apparatus based on a lens model. In an embodiment, a lens model can be any model that characterizes a behavior of a lens. In an embodiment, the lens model may be a physics based mathematical model, an empirical model, a machine learning model, or a combination thereof. The present disclosure is not limited to the type of lens model. In an embodiment, the lens model may represent an optical system/projection system of a lithographic apparatus. In an embodiment, the lens model generates wavefronts corresponding to the tuning scanner. In the method 3000, the generated wavefronts are further used to determine the tuning performance, match the tuning performance with the reference performance and iteratively determine wavefront parameters so that the tuning performance closely matches the reference performance. In an embodiment, the reference performance and the tuning scanner performance are expressed in terms of a contour of a pattern and/or a critical dimension. The different process involved in the method 3000 are further discussed in detail below.

Process P301 involves obtaining a lens model 3001 of a patterning apparatus configured to convert a wavefront parameter of a wavefront to actuator movements, a lens fingerprint 3002 (e.g., using a shearing interferometer) of a tuning scanner, and a reference performance 3007 of a reference apparatus.

The lens model 3001 may be any model configured to convert a wavefront parameter of a wavefront to actuator movements of optical elements of the tuning scanner. The lens model includes constraints related to a correction limitation of the tuning scanner corresponding to a wavefront parameter. In an embodiment, the wavefront parameter may be related to a tilt, offset, curvature of the wavefront, or a combination thereof. The lens 3001 converts the wavefront to the corresponding actuator movements related to change in tilt, offset and/or curvature of the optical elements. Thus, the lens model 3001 accounts for an optical set-up and adjustment mechanisms (and its limitations/constraints) corresponding to the tuning scanner. Accordingly, the lens model 3001 may generate different wavefronts for different scanners, thus enabling a customized wavefront solution corresponding to the tuning scanner.

The lens fingerprint 3002 of a tuning scanner refers to aberrations of the tuning scanner. The lens fingerprint 3002 is typically a characteristic of the projection system (or optical system) of the tuning scanner. Based on the lens fingerprint 3002, a first wavefront (or a first set of wavefronts) may be produced at a first tuning scanner that further determines a first performance of the first tuning scanner. Similarly, a second wavefront may be produced at a second scanner that further determines a second performance, which may be different from the first performance. Such a difference in performance may be undesirable, as it leads to inconsistency in patterns produced within a wafer.

In an embodiment, the lens fingerprint 3002 may be included in a process model to generate simulated wafer patterns. Based on such simulated wafer patterns, a performance of the tuning scanner may be determined. In an embodiment, the lens fingerprint 3002 may be measured via a metrology tool, as mentioned earlier. In another embodiment, the tuning performance (e.g., a contour) may be determined from a printed wafer that is exposed at the tuning scanner.

The reference performance 3007 may be an ideal performance (e.g., discussed with FIG. 5), or a reference performance (e.g., discussed with FIGS. 6A-6C) corresponding to a reference apparatus, or a performance corresponding to another tuning scanner. The reference performance 3007 is used in process P307 to compare with the tuning performance and further determine the wavefront parameters for the tuning scanner. The reference performance 3007 may be expressed in terms of contours, CD, or other parameters of the patterning process that may be affected by or related to a wavefront.

Process P303 involves determining, via a processor (e.g., a processor 104 of FIG. 20) a wavefront 3003 (interchangeably referred as wavefront parameters 3003). In an embodiment, the determining of the wavefront parameter is based on the lens fingerprint 3002 of the tuning scanner, the lens model 3001, and a cost function. The cost function is a difference between a reference performance (e.g., 3007) and a tuning scanner performance. In an embodiment, a tuning scanner performance 3005 may be obtained from simulation of a patterning process, as discussed in processes P305. The simulated performance is further used to evaluate the cost function, as discussed in process P307. In an embodiment, the wavefront 3003 may be an initial wavefront 3003 or an adjusted wavefront 3003 generated during an iteration of wavefront optimization so that the tuning performance 3005 closely matches the reference performance 3007 (e.g., more than 90% contour-to-contour matching).

In an embodiment, the wavefront 3003 at a particular location along a slit may be defined using Zernike polynomial as follow:

$$W(\rho,\theta)=Z_j R_j(\rho,\theta)$$

Where, $W(\rho,\theta)$ is a wavefront at a specific location across the slit, j is an index for the j-th Zernike polynomial (e.g., a Noll index), $Z_j$ is a Zernike coefficient (i.e., a wavefront parameter) representative of the contribution of the j-th Zernike polynomial to the wavefront, and $R_j(\rho, \theta)$ is a polynomial expression characterizing j-th Zernike. In an embodiment, the wavefront parameter is expressed as a vector of such Zernike coefficients.

According to an embodiment, determining the wavefront parameter is an iterative process (e.g., involving processes P305, P307, P309, and P311). An iteration includes generating, via simulation of the lens model 3001 using the lens fingerprint 3002 of the tuning scanner, an initial wavefront 3003 or a set of initial wavefronts (e.g., 4003 of FIG. 4) across different location of a slit, determining a substrate pattern (e.g., 6016 of FIG. 6C) or a set of substrate patterns resulting from the initial wavefront 3003 (e.g., as discussed in process P307), determining the tuning performance (e.g., 6016 of FIG. 6) from the substrate pattern, evaluating the cost function based on the tuning performance and the reference performance 3007 (e.g., as discussed in process P307), and adjusting the wavefront parameter of the initial wavefront 3003 based on a gradient of the cost function, such that the cost function is improved (e.g., as discussed in process P311).

Effectively, the wavefront 3003 comprises a lens fingerprint (e.g., the lens fingerprint 3002 of tuning apparatus) and a performance fingerprint of the lens model. The performance fingerprint refers to values of adjustments of optical elements given the lens fingerprint 3002 of the tuning apparatus. In an embodiment, the lens fingerprint 3002 may be fixed, thus the adjusting of the wavefront parameter 3003 is based on the performance fingerprint of the lens model. In an embodiment, a wavefront may be represented as a combination (e.g., a summation) of the lens fingerprint and the performance fingerprint of the lens model 3001. Thereby, the adjusted wavefront 3003 includes the fixed lens fingerprint and adjustments (or corrections) corresponding to the lens fingerprint of the tuning scanner.

The process P305 involves determining a substrate pattern 3005 from the initial wavefront 3003 (e.g., determined in a $1^{st}$ iteration) or adjusted wavefront 3003 (e.g., in iteration number 2, 3, 4, . . . ). Further, the process P305 involves determining the tuning performance from the substrate pattern. For example, the tuning performance may be a contour (e.g., 6016 of FIG. 6C) of a feature within the substrate pattern 3005. In an embodiment, the tuning performance can be determined using image processing configured to extract information (e.g., contours, CD, EPE, etc.) related to the tuning performance of the tuning scanner. The tuning performance can be further used to compare with the reference performance 3007 and adjust the wavefront such that the tuning performance closely matches the reference performance 3007. An example of comparing reference performance is further discussed with respect to FIGS. 6A-6C.

In an embodiment, determining the substrate pattern involves simulation of a process model of the patterning process using the initial wavefront or adjusted wavefront. The process model may include a mask model configured to predict a mask image based from a mask pattern, an optical model configured to predict an aerial image from the mask image, a resist model configured to predict a resist image based on the aerial image, an etch model configured to predict an etch image based on the resist image, or a combination thereof.

In another embodiment, determining the substrate pattern involves receiving, via a metrology tool, substrate measurements of an exposed substrate, where the substrate is exposed using the wavefront 3003 (e.g., wavefront 4003 in FIG. 4); and determining the substrate pattern based on contour extraction from the substrate measurement. In an embodiment the metrology tool may be an optical tool or an e-beam microscope (e.g., SEM). In an embodiment, the measurement may be a SEM image of an exposed substrate.

Process P307 involves evaluating a cost function based on the tuning performance and the reference performance 3007. In an embodiment, the cost function is a difference between the tuning performance and the reference performance 3007. The cost function may be reduced (in an embodiment, minimized or maximized), for example, by iteratively modifying the wavefront to produce tuning performance closer to the reference performance. In an embodiment, the cost function is an edge placement error, CD, an error within a tolerance band of edge placement (e.g., see FIG. 7). In an embodiment, the cost function is evaluated at the evaluation points (e.g., 6008 of FIG. 6B) along the contour. In an embodiment, the EPE may be minimized or 1/EPE may be maximized.

Process P309 involves determining whether a convergence has been reached. In an embodiment, the convergence may be based on a metric related to a maximum number of iterations, a threshold value related to EPE (CD, or other parameters). In an embodiment, the convergence indicates that there is no further improvement in the tuning scanner performance as a result of wavefront adjustments.

Process P311 involves adjusting the wavefront parameter 3110 of the initial wavefront 3003 (e.g., 4003 in FIG. 4) based on a gradient of the cost function such that the cost function is improved. For example, the gradient may be computed as a derivative of the cost function with respect to EPE (or CD). For example, the gradient may be a partial derivative of the cost function with respect to EPE1, EPE2, EPE3, . . . at different evaluation points along a reference contour. The gradient provides a guidance about which EPEs should be reduced to reduce the value of the cost function. Accordingly, the wavefront parameters are modified so that the resulting contour reduces the respective EPEs. In an embodiment, EPE may be evaluated at different evaluation points at shown and discussed with respect to FIG. 6C. Thus, the adjusted wavefront includes modification of wavefront parameters at one or more location across (e.g., along the length) the slit. In an embodiment, the adjustment includes modifications of Zernike coefficients.

Once an optimized wavefront 3110 for the tuning scanner is determined, the method may further involve converting, via the lens model, the wavefront parameters to the actuator movements, and actuating the optical system of the tuning apparatus based on the actuator movements.

Figure 4:
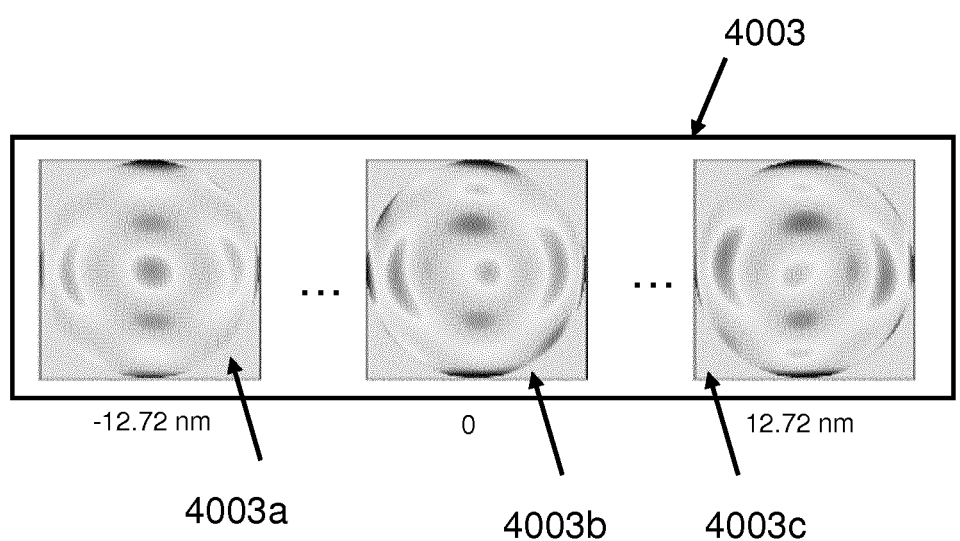
FIG. 4 illustrate example wavefronts at different locations across a slit generated during wavefront optimization process of FIG. 2, according to an embodiment.

FIG. 4 illustrates example wavefronts at different locations across a slit 4003 generated during wavefront optimization process (e.g., 3000 or 8000). FIG. 4 shows a first wavefront 4003a determined at a first location (e.g., a first end of the slit), a second wavefront 4003b determined at a second location (e.g., a center of the slit), a third wavefront 4003c determined at a third location (e.g., a second end of the slit), and so on. Each of the wavefronts 4003a-4003c may potentially contribute to an error (e.g., measured in EPE, CD or other feature related metric) in the printed pattern on a substrate. In an embodiment, the errors (e.g., EPE) are added to determine a cumulative error (e.g., sum of EPEs). The cumulative error may be the cost function, which is further used to adjust a wavefront (i.e., wavefront parameters) such that the cumulative error is reduced (in an embodiment, minimized). For example, referring to FIGS. 6A-6C, EPEs are evaluated at various evaluation points along a contour (e.g., extracted from a simulated pattern) of a tuning scanner and wavefront parameters such as tilt and offset are determined (e.g., in process P303/P805) until the EPE is reduced or minimized (e.g., in process P309/P811). Upon convergence, an optimized version of the wavefronts 4003a-4003c is obtained.

Figure 5:
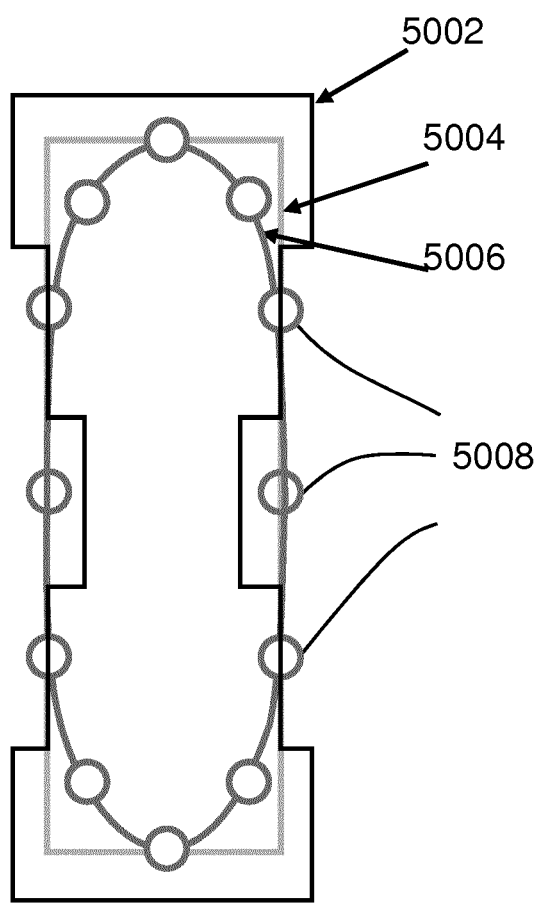
FIG. 5 is an example of an ideal performance corresponding to a scanner with no aberrations, according to an embodiment.

FIG. 5 is an example of an ideal performance corresponding to a scanner with no aberrations. In an embodiment, the ideal performance is represented by a simulated pattern 5006 (interchangeably referred as contour 5006). In FIG. 5, the mask pattern 5002 is a mask pattern with optical proximity correction corresponding to a rectangular shaped design pattern 5004. The mask pattern 5002 is further used to simulate the patterning process thereby generating the simulated pattern 5006. In an embodiment, the simulation includes a process model (e.g., including optical model) without aberrations contributions. The simulated contour 5006 can aligned with the design pattern 5004 to determine, for example, EPE between the contour 5006 and 5004. In an embodiment, evaluation points 5008 may be marked along the simulated contour 5006. The evaluation points 5008 are points along a contour used for evaluation of parameters (e.g., CD) related to a feature or parameters (e.g., EPE). The evaluation may involve making measurements at the evaluation points and/or determining, for example, EPE at one or more of the evaluation points or a CD value (e.g., length or width of the contour 5006) at certain location on the contour 5006. The measurements (e.g., EPE and CD) may be further used in the cost function (e.g., in process P309) to modify the wavefront or the wavefront parameters (e.g., in process P303).

FIG. 6A illustrates an example of a reference contour 6006 overlapped with the ideal contour 5006 of FIG. 5. The reference contour 6006 may be obtained via simulation or measurements of exposed wafer (e.g., from SEM image). The reference contour 6006 accounts for aberrations of the reference apparatus, thereby contour 6006 is different from the ideal contour 5006. In an embodiment, the reference contour 6006 may be obtained via simulation of process models (e.g., mask model, optical model, resist model etc.) with aberration or lens fingerprint (also referred as a reference lens fingerprint) of a reference apparatus as one of the inputs to the simulation. The reference contour 6006 is offset from the ideal contour 5006 when overlapped. In an embodiment, the reference contour 6006 may be used to determine the reference performance (e.g., contour, CD, etc.). Further, wavefront adjustment for the tuning scanner may be determined based on a difference between a tuning performance and the reference performance 6006.

The tuning performance refers to the performance of the tuning scanner. The tuning performance may be determined from a tuning contour 6016 (shown in FIG. 6C) in a similar manner as the reference performance. In an embodiment, the tuning performance (e.g., 6016) may be obtained via simulation of the process models including a lens fingerprint of the tuning scanner. The simulation results in the contour 6016. In an embodiment, the lens fingerprint of the tuning scanner is fixed, while the wavefront parameters are varied to obtain the tuning performance (e.g., 6016) that matches the reference performance (e.g., 6006).

During the wavefront optimization process (e.g., process P303-P311 or P805-P813), the tuning contour 6016 may change depending on the wavefront parameters (e.g., in process P303) employed during simulation of the process model. For example, as the wavefront or the wavefront parameters change, the simulation of the process model generates different tuning contours. Then, a difference of the tuning contour with respect to the reference contour (which may be fixed) is be determined.

For example, the tuning contour 6016 may be aligned with the reference contour 6006 (shown in FIG. 6C) and a difference between the contours 6006 and 6016 may be determined. The difference may be EPE, CD, or other parameters related to the features. In an embodiment, the difference between the contours 6006 and 6016 may be determined at evaluation points 6008, which serve similar purpose as points 5008 of FIG. 5. For example, evaluation points 6008 (shown in FIG. 6B) may be marked on the reference contour 6006 and a difference (e.g., EPE, CD, etc.) between contours 6006 and 6016 may be determined at such points 6008.

Figure 7:
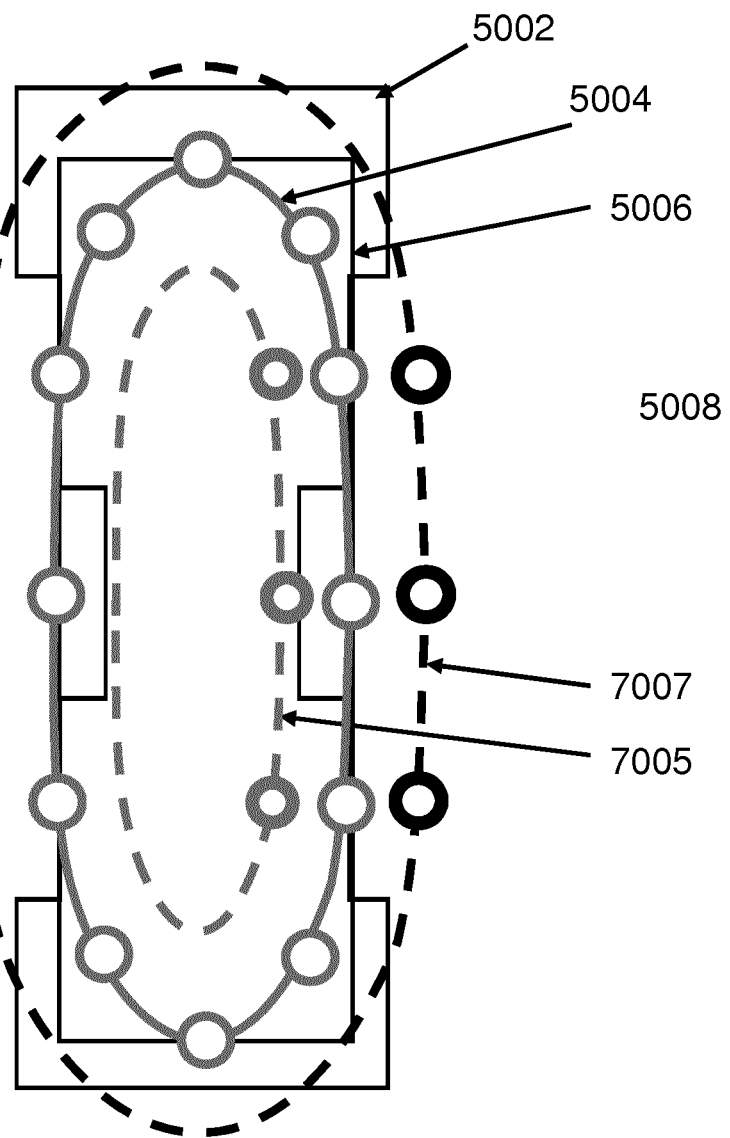
FIG. 7 illustrates a tolerance band for a contour or edge placement error (EPE) based matching of tuning scanner, according to an embodiment.

FIG. 7 illustrates a tolerance band for a contour based matching of tuning scanner. The tolerance band refers to an upper limit and a lower limit of the contour (or related metric such as EPE or CD) with respect to a reference contour or an ideal contour. In FIG. 7, an ideal contour 5006 (or reference contour 6006) corresponding to the feature 5004 is used as reference and the upper limit (e.g., 7007) and a lower limit (e.g., 7005) is set around the contour 5006. In an embodiment, the upper limit is an outer offset contour 7007 and the lower limit is an inner offset contour 7005. The outer offset contour 7007 and the inner offset contour 7005 are contours obtained by offsetting the ideal contour 5006 by a pre-determined distance.

Further evaluation points may be marked on the contours 7005 and 7007 to determine whether a tuning performance (e.g., a tuning contour) is within the tolerance band (i.e., within the contour 7007 and 7005). In an embodiment, during the wavefront optimization process (e.g., processes P303-P311 or P805-P813), the wavefront parameters may be modified until the tuning contour is contained within the tolerance band.

FIG. 8 is a flow chart of another for wavefront optimization of a tuning scanner with respect to a reference apparatus. The method involves obtaining a reference performance (e.g., 8003 from process P803) of a reference apparatus corresponding to a reference lens fingerprint 8001 (e.g., using a shearing interferometer), and a lens fingerprint (e.g., 8004) of a tuning scanner. Further, the method involves determining (e.g., in process P805) a wavefront parameter of the tuning scanner based on the lens fingerprint 8005 and a cost function, where the cost function computes a difference between the reference performance and a tuning scanner performance. The reference performance and the tuning performance (e.g., contours of FIGS. 6B-6C) are similar to that discussed with respect to FIG. 3.

According to an embodiment, the determining of the wavefront parameter is an iterative process (e.g., involving process P805, P807, P809, P811, and/or P813). An iteration includes determining, via simulation of the process model, a substrate pattern (e.g., 8005) using a patterning device pattern (e.g., a through-slit mask 8002) and a lens fingerprint (8007) of the tuning scanner, determining the tuning scanner performance based on the substrate pattern (e.g., 8008), followed by evaluating (e.g., process P809) the cost function based on the tuning scanner performance and the reference performance, and adjusting (e.g., process P813) the wavefront parameter based on a gradient of the cost function with respect to the wavefront parameter, such that the cost function is improved. The different process involved in the method 8000 are further discussed in detail below.

Process P801 involves obtaining a reference performance 8001 of the reference apparatus, a patterning device pattern (e.g., a through-slit mask), and a lens fingerprint 8005 of a tuning scanner. In an embodiment, a "through-slit mask" is post OPC mask for specific slit positions (e.g., along a length of a slit) to compensate for the proximity and shadow effect which varies thru-slit.

In an embodiment, a through-slit mask (e.g., 8002) is generated via simulation of a phase control source mask optimization process, where a lens aberration model is included in the source mask optimization (SMO) process. The SMO is an illumination mode and patterning device pattern optimization method that allows for simultaneous optimization of the illumination mode and the patterning device pattern using an objective function without constraints and within a practicable amount of time is described in PCT Patent Application Publication No. WO 2010/059954, titled "Fast Freeform Source and Mask Co-Optimization Method", which is hereby incorporated by reference in its entirety. Another illumination and patterning device optimization method and system that involves optimizing the illumination by adjusting pixels of the illumination distribution is described in U.S. Patent Application Publication No. 2010/0315614, titled "Source-Mask Optimization in Lithographic Apparatus", which is hereby incorporated by reference in its entirety.

In an embodiment, when a light propagating through-slit is passed over patterning device pattern 8002 (e.g., a mask pattern or a through-slit mask) and the optical system, a substrate pattern of desired layout or design layout is printed on the substrate. The printed pattern is a function of the wavefront generated by a patterning apparatus (e.g., a reference apparatus or the tuning scanner). As mentioned earlier, the wavefront is a function of characteristics (e.g., aberrations) of the optical system. Thus, depending on the lens fingerprints (e.g., 8001 and 8007) a scanner may produce different patterns/performance.

In an embodiment, the reference performance (e.g., 6006) may be obtained via measurements on a wafer printed on a reference apparatus or via simulation of process model configured to predict reference performance.

For example, in process P803, the reference performance is determined by measuring the reference lens fingerprint 8001 of the reference apparatus, generating, via simulation of a process model, a reference pattern based on the measured lens fingerprint of the reference apparatus and a through-slit mask corresponding to a design layout, and determining the reference performance 8003 based on a contour of the reference pattern (e.g., as discussed earlier with respect to FIGS. 5, 6A-6C and 7).

In an embodiment, the reference apparatus may be a scanner of a wafer fabrication facility, an ideal scanner having no optical aberrations; and/or an aberration compensated scanner that is compensated for average aberration of a plurality of scanners within the wafer fabrication facility.

Process P805 (similar to P305) involves determining a wavefront parameter of the tuning scanner. For example, as discussed in P305, the wavefront parameter may be tilt, offset, and/or curvature of the wavefront. In an embodiment, the wavefront may be expressed as Zernike polynomial and the wavefront parameters are the Zernike coefficients.

Process P807 involves determining via simulation of the process model, the substrate pattern 8008 using a patterning device pattern, and the lens fingerprint 8007 of the tuning scanner, and determining the tuning scanner performance (e.g., 6016) based on the substrate pattern 8008 (interchangeably referred as performance 8008). As mentioned earlier, the process model may be a mask model, optical model, resist model, or a combination thereof.

Process P809 (similar to P307) involves evaluating the cost function based on the tuning scanner performance 8008 and the reference performance 8003. For example, the cost function may be a difference between the performances. In an embodiment, the cost function is an edge placement error, CD and/or an error within a tolerance band of edge placement.

Process P811 involves determining whether a convergence has been reached. Similar to process P309, for example, the convergence may be based on a metric related to a maximum number of iterations, a threshold value related to EPE (CD, or other parameters). In an embodiment, the convergence indicates that there is no further improvement in the tuning scanner performance as a result of wavefront adjustments.

Process P813 involves adjusting the wavefront parameter 8110 based on a gradient of the cost function with respect to the wavefront parameter, such that the cost function is improved. Similar to process P311 and discussed in FIG. 6C, for example, the gradient may be computed as a derivative of the cost function with respect to with respect to EPE (or CD). In an embodiment, the adjustment includes modifications of Zernike coefficients.

FIG. 9 is a flow chart of a method for determining wavefront based on hot spot patterns. For example, the tuning scanner performance may be evaluated with respect to hot spot patterns, over different periods of time during the patterning process to ensure a consistent performance of the tuning scanner. In an embodiment, the evaluation may involve comparison with reference performance stored in a database. The database includes previously determined optimized wavefront parameters for one or more (in an embodiment, each) hot spot pattern. Based on the comparison with the reference performance, a set of wavefront parameters may be selected to adjust the tuning scanner.

Process P901 involves obtaining a plurality of hot spot patterns corresponding to a layer of a substrate, a plurality of wavefronts 9001 (e.g., obtained from methods 3000 or 4000) corresponding to the plurality of hot spot patterns, and a lens fingerprint (e.g., 3002, 8007, etc.) of a tuning scanner. An example method of obtaining hot spot patterns is discussed in FIG. 11

In an embodiment, one or more of the plurality of wavefronts include optimized wavefront parameters (e.g., 3110 or 8110). Furthermore, the one or more of the plurality of wavefronts is associated with a particular reference performance. Such relational information related to the hot spot patterns and the reference performance can be stored in a database (e.g., a database 152 of FIG. 20) and retrieved to tune a scanner. In an embodiment, the tuning may be offline or real-time, for example, during a manufacturing process.

Process P903 (similar to processes P807) involves determining, via simulation of a patterning process using the lens fingerprint, a tuning scanner performance. An example of the simulation process is discussed in FIG. 10. Further, process P905 involves selecting, via a processor (e.g., processor 104 of FIG. 20) wavefront parameters for the tuning scanner from the plurality of wavefronts based on comparison between the tuning scanner performance and a reference performance.

For example, if the tuning performance substantially deviates from the reference performance, then the reference performance that matches the tuning scanner performance may be retrieved from the database 152 and the corresponding optimized wavefront parameters may be used as for the tuning scanner.

The above methods of wavefront optimization to achieve consistency in patterning process enable chipmaker to improve scanner to scanner performance matching, e.g., EPE and or CD through slit matching. The matching process eliminate the time consuming lens setup procedure and scanner down time for a specific technology node and layer. Also, with above methods, the productivity can be improved in real-time. Thus, the productivity is not dedicated to reticle and/or scanner improvement.

Figure 10:
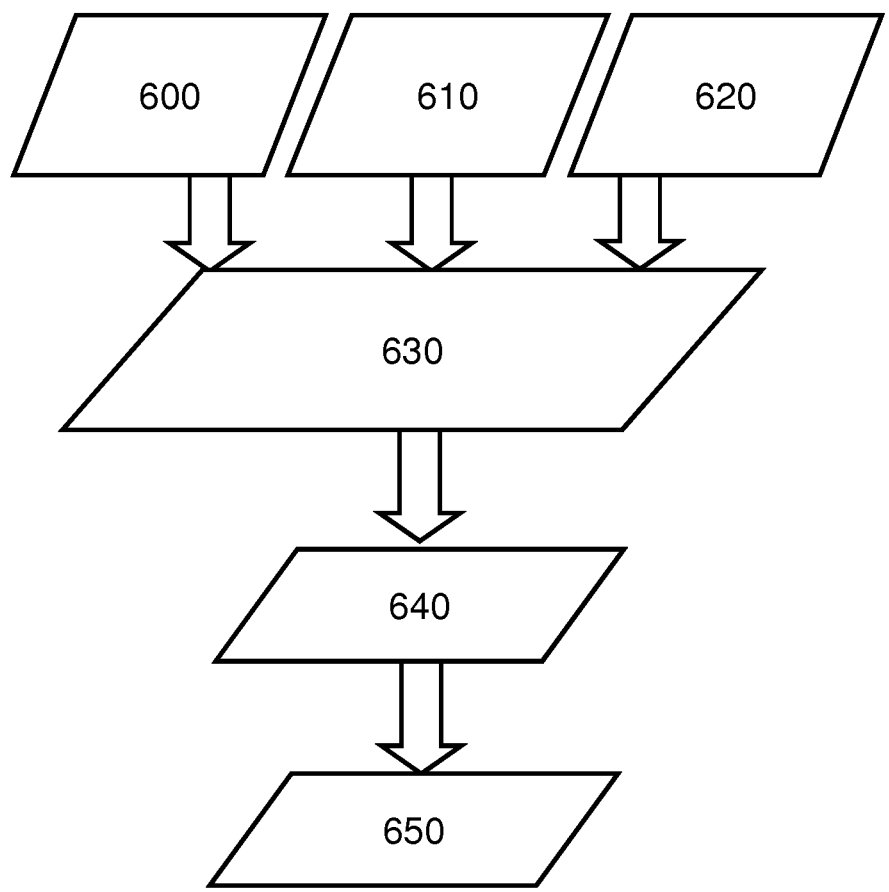
FIG. 10 is a flow chart of simulation of a patterning process, according an embodiment.

An exemplary flow chart for modeling and/or simulating parts of a patterning process (e.g., lithography in a lithographic apparatus) is illustrated in FIG. 10. As will be appreciated, the models may represent a different patterning process and need not comprise all the models described below. A source model 600 represents optical characteristics (including radiation intensity distribution, bandwidth and/or phase distribution) of the illumination of a patterning device. The source model 600 can represent the optical characteristics of the illumination that include, but not limited to, numerical aperture settings, illumination sigma (σ) settings as well as any particular illumination shape (e.g. off-axis radiation shape such as annular, quadrupole, dipole, etc.), where σ (or sigma) is outer radial extent of the illuminator.

A projection optics model 610 represents optical characteristics (including changes to the radiation intensity distribution and/or the phase distribution caused by the projection optics) of the projection optics. The projection optics model 610 can represent the optical characteristics of the projection optics, including aberration, distortion, one or more refractive indexes, one or more physical sizes, one or more physical dimensions, etc.

The patterning device model module 120 captures how the design features are laid out in the pattern of the patterning device and may include a representation of detailed physical properties of the patterning device, as described, for example, in U.S. Pat. No. 7,587,704. The objective of the simulation is to accurately predict, for example, edge placements and CDs, which can then be compared against the device design. The device design is generally defined as the pre-OPC patterning device layout, and will be provided in a standardized digital file format such as GDSII or OASIS.

A design layout model 620 represents optical characteristics (including changes to the radiation intensity distribution and/or the phase distribution caused by a given design layout) of a design layout (e.g., a device design layout corresponding to a feature of an integrated circuit, a memory, an electronic device, etc.), which is the representation of an arrangement of features on or formed by the patterning device. The design layout model 620 can represent one or more physical properties of a physical patterning device, as described, for example, in U.S. Pat. No. 7,587,704, which is incorporated by reference in its entirety. Since the patterning device used in the lithographic projection apparatus can be changed, it is desirable to separate the optical properties of the patterning device from the optical properties of the rest of the lithographic projection apparatus including at least the illumination and the projection optics.

An aerial image 630 can be simulated from the source model 600, the projection optics model 610 and the design layout model 620. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 650 can be simulated from the aerial image 630 using a resist model 640. The resist model can be used to calculate the resist image from the aerial image, an example of which can be found in U.S. Patent Application Publication No. US 2009-0157360, the disclosure of which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 610.

So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model module 150. The post-pattern transfer process model 150 defines performance of one or more post-resist development processes (e.g., etch, development, etc.).

Simulation of the patterning process can, for example, predict contours, CDs, edge placement (e.g., edge placement error), etc. in the resist and/or etched image. Thus, the objective of the simulation is to accurately predict, for example, edge placement, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

Inspection of, e.g., semiconductor wafers is often done with optics-based sub-resolution tools (bright-field inspection). But, in some cases, certain features to be measured are too small to be effectively measured using bright-field inspection. For example, bright-field inspection of defects in features of a semiconductor device can be challenging. Moreover, as time progresses, features that are being made using patterning processes (e.g., semiconductor features made using lithography) are becoming smaller and in many cases, the density of features is also increasing. Accordingly, a higher resolution inspection technique is used and desired. An example inspection technique is electron beam inspection. Electron beam inspection involves focusing a beam of electrons on a small spot on the substrate to be inspected. An image is formed by providing relative movement between the beam and the substrate (hereinafter referred to as scanning the electron beam) over the area of the substrate inspected and collecting secondary and/or backscattered electrons with an electron detector. The image data is then processed to, for example, identify defects.

So, in an embodiment, the inspection apparatus may be an electron beam inspection apparatus (e.g., the same as or similar to a scanning electron microscope (SEM)) that yields an image of a structure (e.g., some or all the structure of a device, such as an integrated circuit) exposed or transferred on the substrate.

Figure 11:
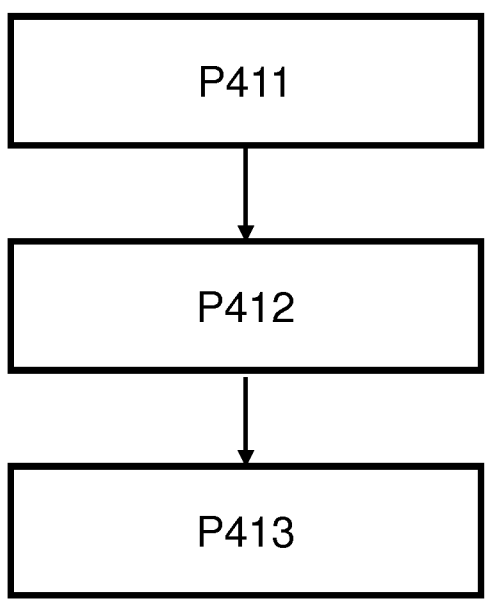
FIG. 11 is a flow chart of determining hot spot patterns, according an embodiment.

FIG. 11 shows a flow chart for a method of determining existence of defects in a lithography process, according to an embodiment. In process P411, hot spots or locations thereof are identified using any suitable method from patterns (e.g., patterns on a patterning device). For example, hot spots may be identified by analyzing patterns on patterns using an empirical model or a computational model. In an empirical model, images (e.g., resist image, optical image, etch image) of the patterns are not simulated; instead, the empirical model predicts defects or probability of defects based on correlations between processing parameters, parameters of the patterns, and the defects. For example, an empirical model may be a classification model or a database of patterns prone to defects. In a computational model, a portion or a characteristic of the images is calculated or simulated, and defects are identified based on the portion or the characteristic. For example, a line pull back defect may be identified by finding a line end too far away from its desired location; a bridging defect may be identified by finding a location where two lines undesirably join; an overlapping defect may be identified by finding two features on separate layers undesirably overlap or undesirably not overlap. An empirical model is usually less computationally expensive than a computational model. It is possible to determine and/or compile process windows of the hot spots into a map, based on hotspot locations and process windows of individual hot spots—i.e. determine process windows as a function of location. This process window map may characterize the layout-specific sensitivities and processing margins of the patterns. In another example, the hot spots, their locations, and/or their process windows may be determined experimentally, such as by FEM wafer inspection or a suitable metrology tool. The defects may include those defects that cannot be detected in an after-development-inspection (ADI) (usually optical inspection), such as resist top loss, resist undercut, etc. Conventional inspection only reveals such defects after the substrate is irreversibly processed (e.g., etched), at which point the wafer cannot be reworked. So, such resist top loss defects cannot be detected using the current optical technology at the time of drafting this document. However, simulation may be used to determine where resist top loss may occur and what the severity would be. Based on this information, it may be either decided to inspect the specific possible defect using a more accurate inspection method (and typically more time consuming) to determine whether the defect needs rework, or it may be decided to rework the imaging of the specific resist layer (remove the resist layer having the resist top loss defect and recoat the wafer to redo the imaging of the specific layer) before the irreversible processing (e.g., etching) is done.

In process P412, processing parameters under which the hot spots are processed (e.g., imaged or etched onto a substrate) are determined. The processing parameters may be local—dependent on the locations of the hot spots, the dies, or both. The processing parameters may be global—independent of the locations of the hot spots and the dies. One exemplary way to determine the processing parameters is to determine the status of the lithographic apparatus. For example, laser bandwidth, focus, dose, source parameters, projection optics parameters, and the spatial or temporal variations of these parameters, may be measured from the lithographic apparatus. Another exemplary way is to infer the processing parameters from data obtained from metrology performed on the substrate, or from operator of the processing apparatus. For example, metrology may include inspecting a substrate using a diffractive tool (e.g., ASML YieldStar), an electron microscope, or other suitable inspection tools. It is possible to obtain processing parameters for any location on a processed substrate, including the identified hot spots. The processing parameters may be compiled into a map—lithographic parameters, or process conditions, as a function of location. Of course, other processing parameters may be represented as functions of location, i.e., a map. In an embodiment, the processing parameters may be determined before, and preferably immediately before processing each hotspot.

In process P413, existence, probability of existence, characteristics, or a combination thereof, of a defect at a hot spot is determined using the processing parameters under which the hot spot is processed. This determination may be simply comparing the processing parameters and the process window of the hot spot—if the processing parameters fall within the process window, no defect exists; if the processing parameters fall outside the process window, at least one defect will be expected to exist. This determination may also be done using a suitable empirical model (including a statistical model). For example, a classification model may be used to provide a probability of existence of a defect. Another way to make this determination is to use a computational model to simulate an image or expected patterning contours of the hot spot under the processing parameters and measure the image or contour parameters. In an embodiment, the processing parameters may be determined immediately (i.e., before processing the pattern or the next substrate) after processing a pattern or a substrate. The determined existence and/or characteristics of a defect may serve as a basis for a decision of disposition: rework or acceptance. In an embodiment, the processing parameters may be used to calculate moving averages of the lithographic parameters. Moving averages are useful to capture long term drifts of the lithographic parameters, without distraction by short term fluctuations.

In an embodiment, hot spots are detected based on the simulated image of pattern on a substrate. Once the simulation of the patterning process (e.g., including process models such OPC and manufacturability check) is complete, potential weak points, i.e., hot spots, in the design as a function of process conditions may be computed according to one or more definitions (e.g., certain rules, thresholds, or metrics). Hot spots may be determined based on absolute CD values, on the rate of change of CD vs. one or more of the parameters that were varied in the simulation ("CD sensitivity"), on the slope of the aerial image intensity, or on NILS (i.e., "edge slope," or "normalized image log slope," often abbreviated as "NILS." Indicating lack of sharpness or image blur) where the edge of the resist feature is expected (computed from a simple threshold/bias model or a more complete resist model). Alternatively, hot spots may be determined based on a set of predetermined rules such as those used in a design rule checking system, including, but not limited to, line-end pullback, corner rounding, proximity to neighboring features, pattern necking or pinching, and other metrics of pattern deformation relative to the desired pattern. The CD sensitivity to small changes in mask CD is a particularly important lithographic parameter known as MEF (Mask Error Factor) or MEEF (Mask Error Enhancement Factor). Computation of MEF vs. focus and exposure provides a critical metric of the probability that mask process variation convolved with wafer process variation will result in unacceptable pattern degradation of a particular pattern element. Hot spots can also be identified based on variation in overlay errors relative to underlying or subsequent process layers and CD variation or by sensitivity to variations in overlay and/or CD between exposures in a multiple-exposure process.

Figure 12A:
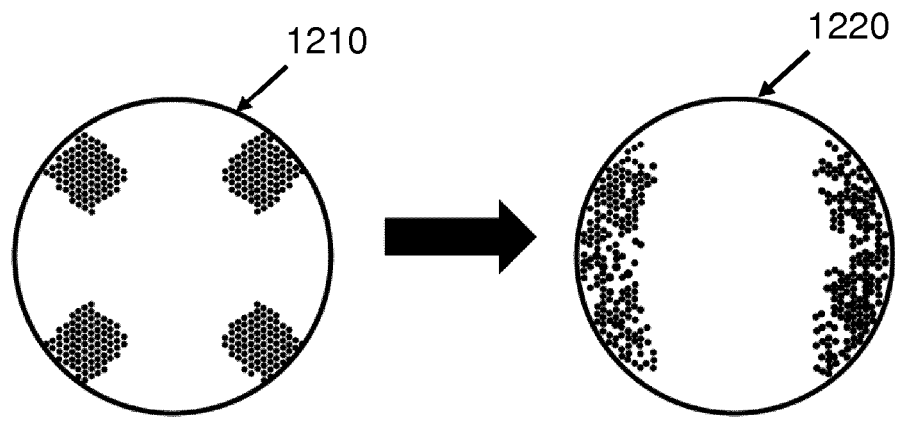
FIG. 12A is example of a pupil optimization, according an embodiment.
Figure 12B:
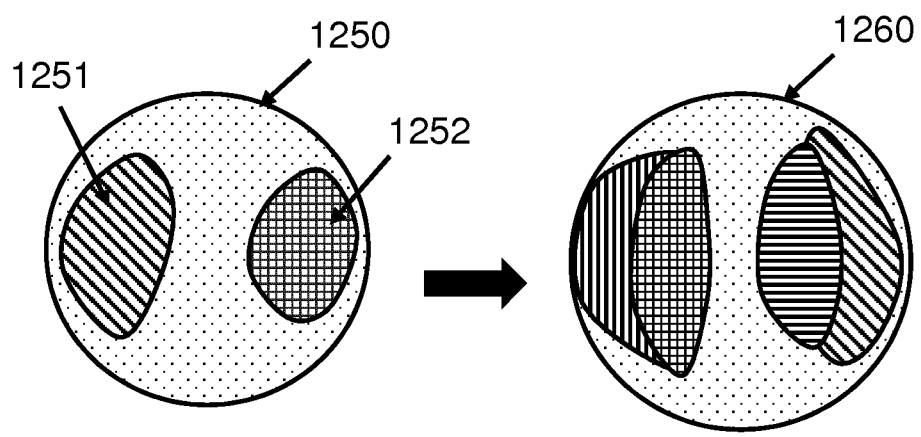
FIG. 12B illustrates example lens fingerprint and optimized wavefront based on the lens fingerprint, according an embodiment.

A wavefront offset solution configured to optimize performance per layer and per scanner via compensating for Lens FingerPrint (LFP) offset. LFP refers to a lens aberration specific to a scanner being tuned. In an embodiment, the wavefront offset solution involves pupil optimization (e.g., FIG. 12A), where a pupil is determined based on aberration characteristics of a lens. The pupil optimization may be performed to minimize layer's sensitivity to aberration that are actually present in a scanner. For example, the pupil 1210 is optimized to generate an optimized pupil 1220. Further the solution may involve wavefront optimization based on the LFP of the scanner. For example, FIG. 12B illustrates example LFP 1250 of the to-be-tuned scanner used to generate an optimized wavefront 1260. The LFP 1250 of the scanner includes aberrations in pupil areas 1251 and 1252. As discussed earlier, the wavefront optimization is based on matching a wavefront (e.g., 1260) with a reference wavefront (e.g., an ideal wavefront). However, the LFP based wavefront optimization is specific to a particular scanner. The solution compensates for aberrations in layer sensitive pupil areas. In an addition, the solution is limited to lens correction potential of the scanner.

The Wavefront Offset solution does not consider mirror heating transient. The mirror heating transient refers to lens aberrations or changes to lens aberrations caused due to heating of mirrors of the lens during imaging of a substrate via a patterning apparatus. In an embodiment, one or more patterns may be more sensitive to the mirror heating transient than other patterns.

Thus, the Wavefront Offset solution has several limitation compared to a Lithographic metric solution. For example, the limitations include, but not limited to: (i) optimize for static aberration components (LFP, MH saturation), but not for dynamic aberration components (MH transients, intra lot mirror drift); (ii) the solution requires a correction recipe per scanner rather than the same recipe for all scanner; (iii) the solution requires a regular update of the correction recipe if the scanner lens calibration has been updated or if the LFP drifts. As a result a regular monitoring may be desired for re-optimization; and (iv) the optimization is based on through slit variation.

The present methods (e.g., 1300 and 1800) provide a lithographic metric based solution for optimizing of the performance of all scanners. On the other hand, the wavefront offset solution determines wavefront adjustment parameters per scanner based on a reference or ideal wavefront and a scanner specific LFP. Such LFP based optimization may not be determine wavefront parameters applicable to other scanners in the substrate manufacturing process.

In an embodiment, a lithographic metric is associated with a layer specific optimization of the merit function of the Lens model (DLM) used during lot control. Example of lithographic metric is a function of EPE and a pattern placement error (PPE), further discussed in a method 1300 of FIG. 13 detail below. In an embodiment, the lithographic metric is a function of sensitivity of a lens knob setting to a residual aberration wavefront and measured wavefront, further discussed in method 1800 of FIG. 18.

Figure 13A:
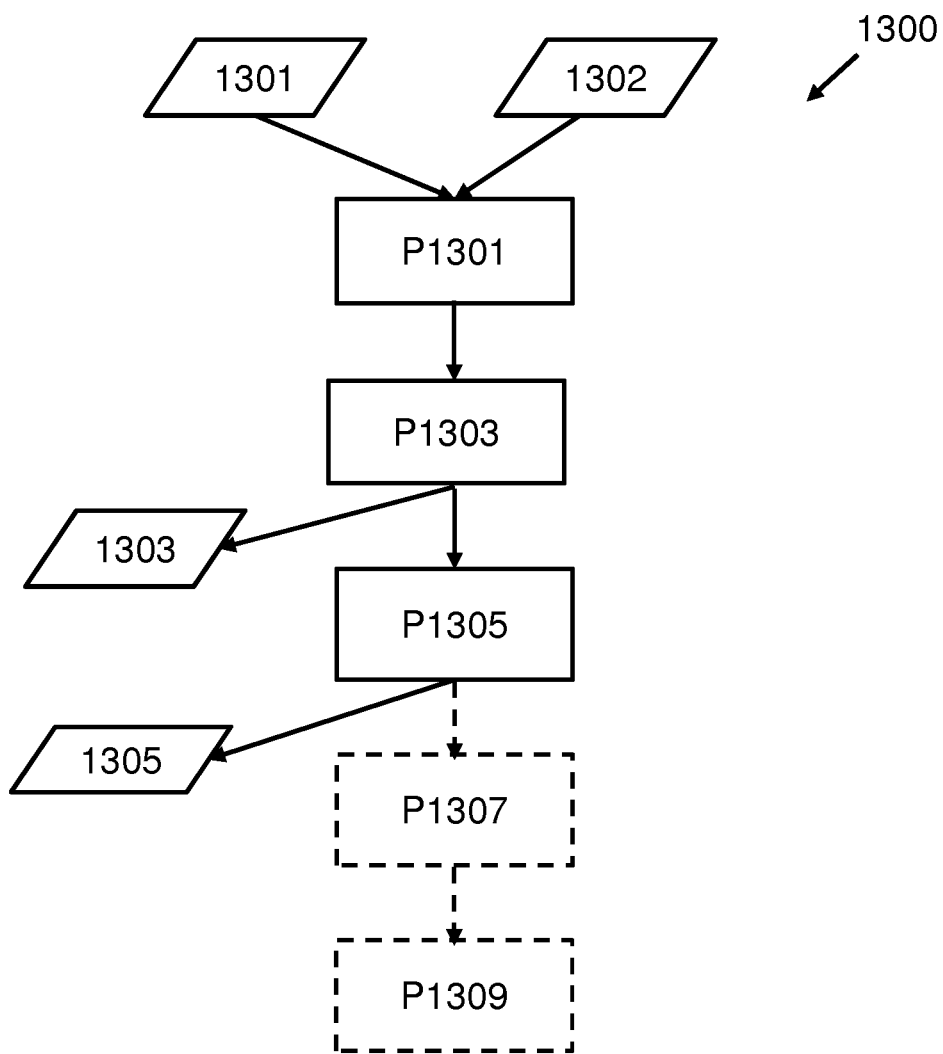
FIG. 13A and FIG. 13B describes a method for determining a lens adjustment parameter value for a patterning apparatus used in a patterning process, according an embodiment.
Figure 13B:
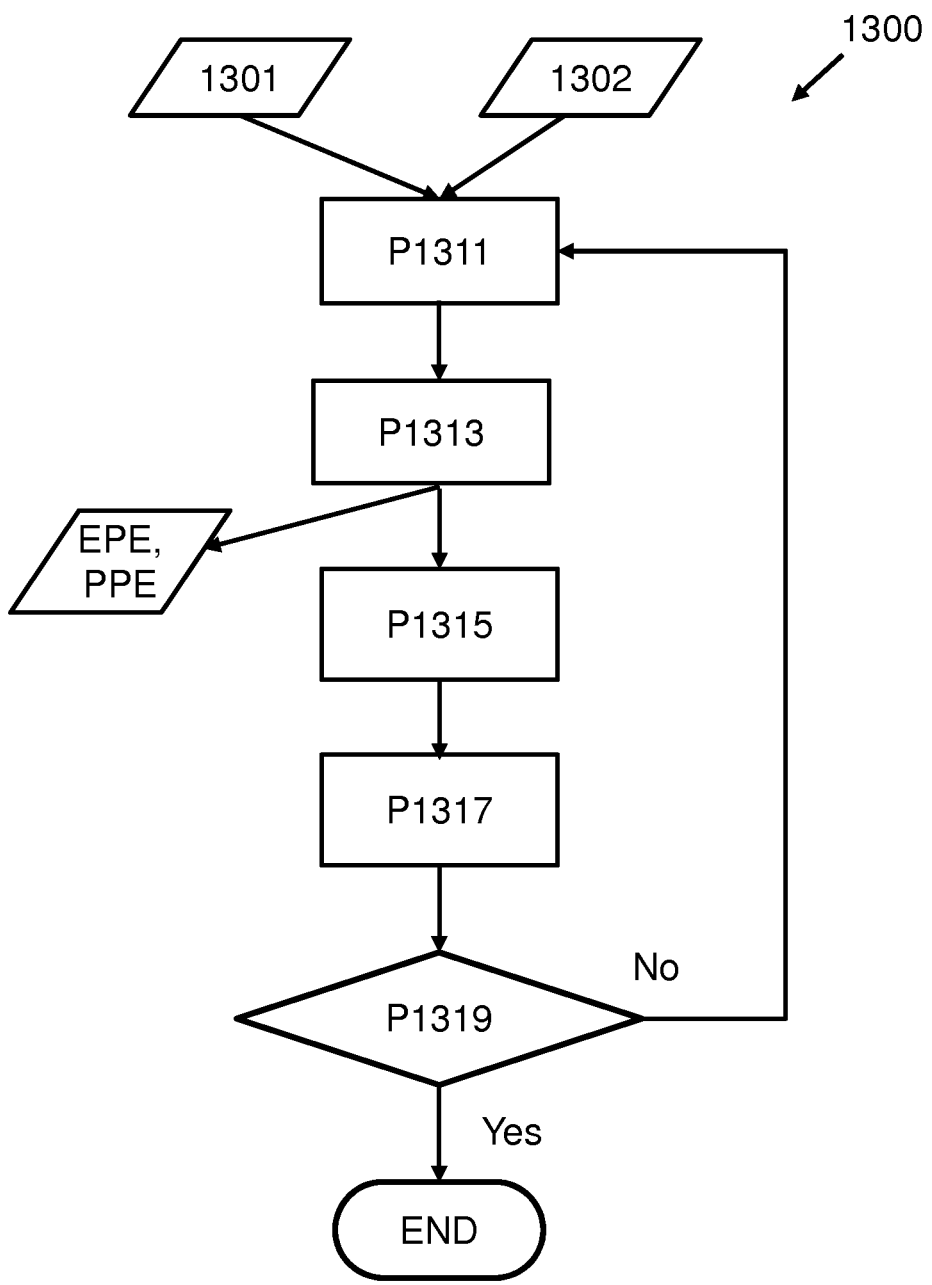

FIG. 13A describes a method 1300 for determining a lens adjustment parameter value for a patterning apparatus used in a patterning process. In an embodiment, the method 1300 is an optimization process where the goal is not to optimize scanner-to-scanner performance based on e.g., CD matching, rather the method 1300 optimizes an overlay, EPE or defect performance of any scanner of the chip manufacturing unit. Further, the method 1300 does not necessarily optimize a wavefront, rather the method optimizes a lithographic metric (e.g., a function of EPE and PPE). Furthermore, the method 1300 can be extended to be used with optimizing one or more aspects (e.g., SMO or process window) of the patterning process. For example, the SMO process may be tuned based on the lithographic metric so that a ratio of CD to PPE is within a desired range.

According to present disclosure, using the method 1300 with SMO can improve on-product overlay performance in two ways. First, the method 1300 enables reducing odd Zernike (e.g. Z7) sensitivity that will reduce a feature dependent overlay contribution to the on-product overlay budget. Secondly, deweighing non-relevant areas (e.g., associated with Z7) of the illumination pupil gives the lens model more correction capability for relevant Zernike components (e.g., associated with higher correction potential of a scanner). For example, including the slit orders of Z2 and Z3, which are directly associated with overlay correction capability. The method 1300 employing a pupil weight map and a lithographic metric to obtain lens adjustment parameters is further explained with procedures P1301, 1303 as follows Procedure P1301 involves obtaining (i) a pupil weight map associated with an exposure wavefront, wherein weights of the pupil weight map are associated with a performance metric of the patterning apparatus, and (ii) a lens model of a patterning apparatus, the lens model configured to convert an aberration wavefront parameter associated with the exposure wavefront to a lens adjustment parameter.

In an embodiment, the exposure wavefront is a through-slit wavefront. The slit has a rectangular shape. In an embodiment, the slit field has a curved shape.

In an embodiment, the lens model 1301 includes constraints related to correction limitations of the patterning apparatus corresponding to the given radiation wavefront. For example, as discussed earlier, certain aberrations related to an optical system may be correctable via lens adjustments associated with, e.g., lower order Zernikes (e.g., Z1-Z5), while some aberrations associated with e.g., higher order Zernikes (e.g., Z10, Z24, Z30, etc.) are not correctable. In an embodiment, the wavefront may be presented by, for example, a combination of Zernike polynomials and the higher order Zernikes may be correctable via a related lower order Zernikes. In an embodiment, the combination of Zernike polynomials that explain most aberrations may be obtained via a principal component analysis (PCA). Each principal component identified by the PCA may represent a different wavefront. In an embodiment, such PCA may be used to determine a pupil weight map 1302.

In an embodiment, the pupil weight map 1302 is a pixelated image, wherein a given pixel of the pixelated image is assigned a weight based on an impact of change in the given pixel value on the performance metric (e.g., including EPE and PPE). The weights of the pupil weight map 1302 may be assigned in several ways, including but not limited to, diffraction orders, a linear combination of Zernike polynomials, principal component analysis (PCA) a set of wavefront associated with different scanners, a mini-batch algorithm (where wavefront data from different scanners is split into batches and used to update weight map), or other appropriate parameters associated with the aberration wavefront. In an embodiment, the mini-batch data is associated with different setting (e.g., dose, focus) used to image a substrate.

In an embodiment, the weights of the pupil weight map are based on diffraction information associated with an illumination pupil, where the diffraction information comprises diffraction orders and/or diffraction intensity pattern. In an embodiment, a portion of the pupil weight map associated with a diffraction order is assigned a weight 1 and another portion not associated with the diffraction order is assigned a weight 0.

Figure 14:
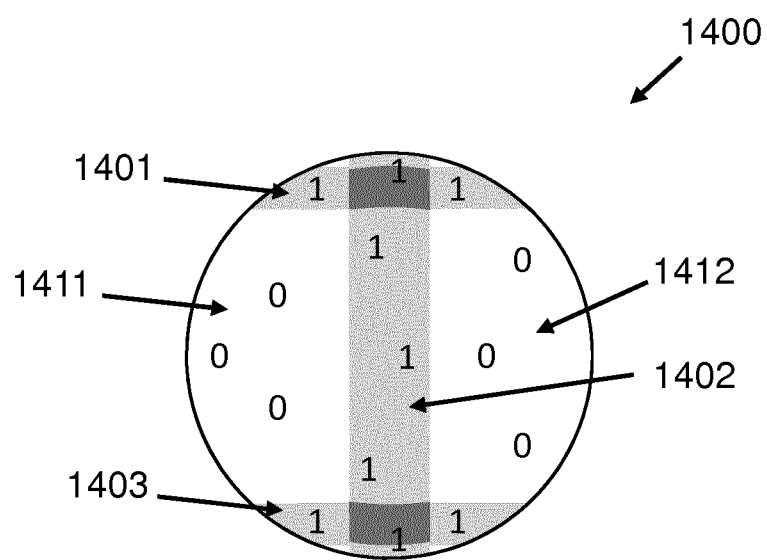
FIG. 14 is an example of a pupil weight map based on a dipole pupil, according an embodiment.

An example of such pupil weight map based on a dipole pupil is illustrated in FIG. 14. A pupil weight map 1400 (an example of map 1302) comprises weights 1 assigned to portions 1401, 1402 and 1402 associated with a corresponding (similar) pupil shape. Furthermore, portions 1411 and 1412 includes weights 0. In an embodiment, the pupil weight map 1400 is used as a lithographic metric. Thus, during an optimization process (e.g., SMO or patterning process window optimization, etc.), wavefronts (e.g., represented by Zernike polynomials) associated with such portions 1401, 1402, 1403 are assigned higher weights to generate an improved output (e.g., mask pattern, process window etc.) compared to existing approaches. In an embodiment, the pupil shape refers to portions of the pupil that are illuminated so as to compensate for particular aberrations of a lens. It can be understood that the pupil weight map 1400 is an example and the weights are not limited to weights 0 and 1.

Figure 15A:
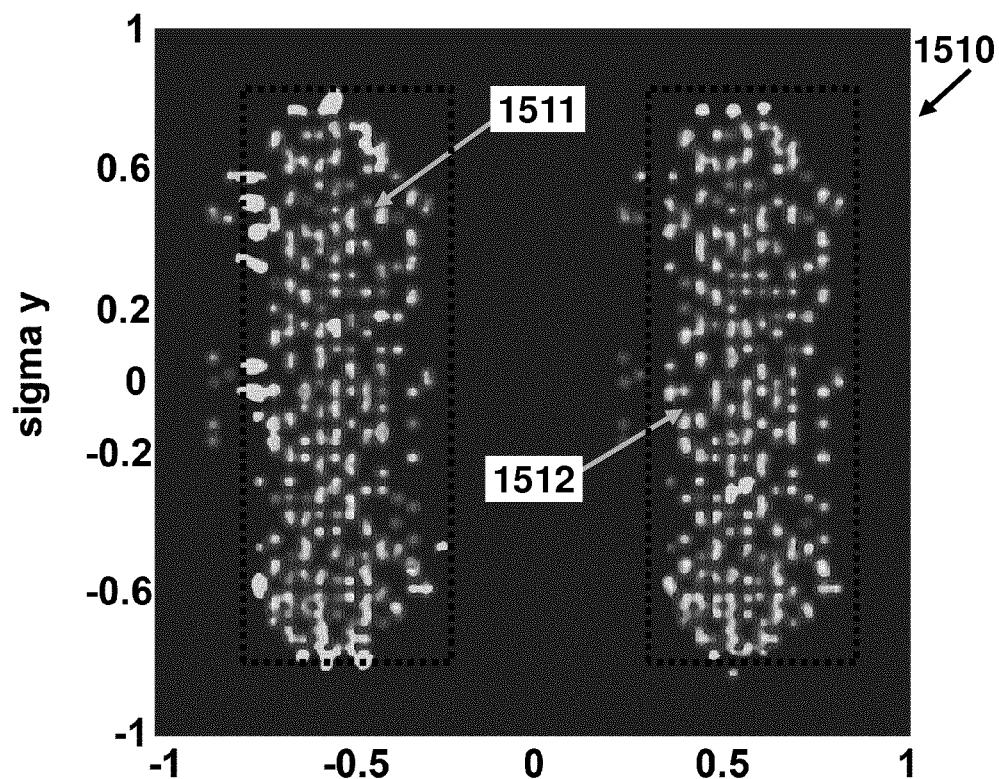
FIGS. 15A and 15B illustrate another example of generating a pupil weight map based on illumination pattern, according an embodiment.
Figure 15B:
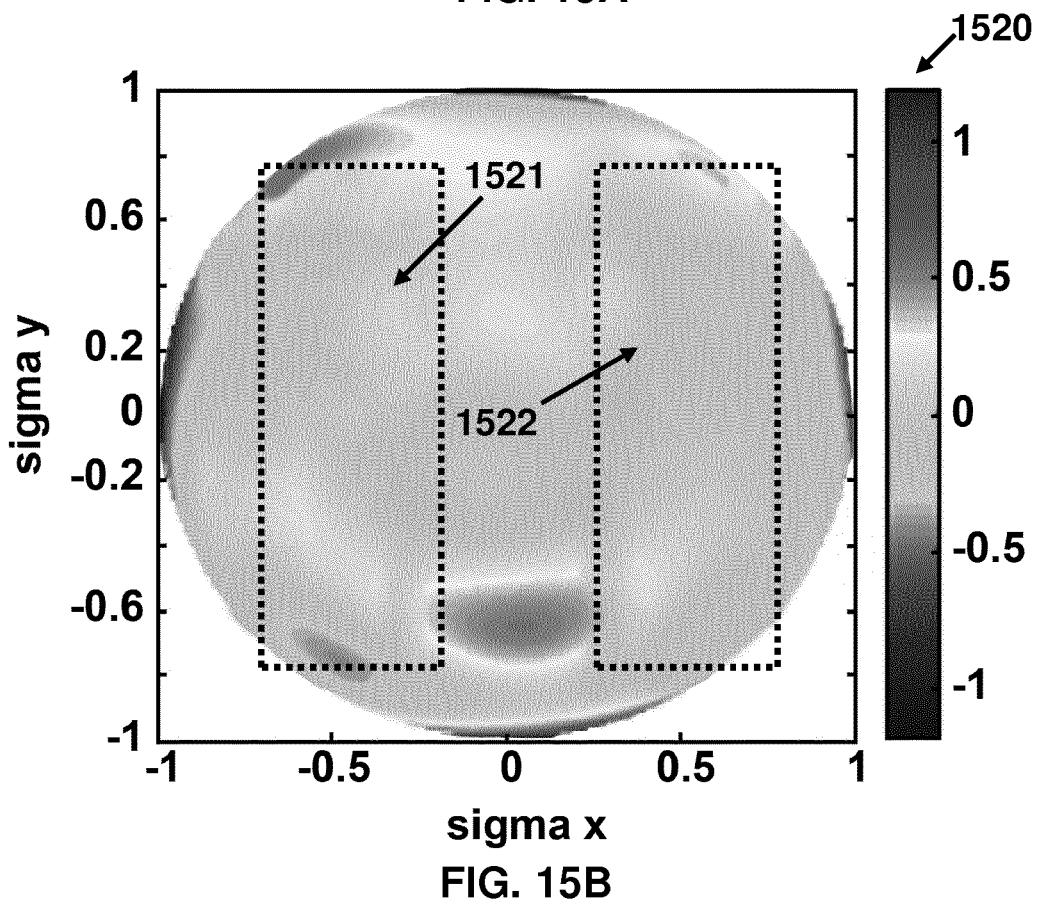

FIGS. 15A and 15B illustrate another example of generating a pupil weight map based on illumination pattern. In FIG. 15A, an illumination pattern 1510 comprising diffraction orders in portions 1511 and 1512, and no diffraction orders in the remaining locations associated with an illumination pupil. Based on such illumination pattern 1510, an aberration wavefront 1520 (in FIG. 15B) is generated. Then, according to present disclosure, locations 1521 and 1522 of the wavefront associated with the diffraction orders (e.g., portions locations 1511 and 1512 in FIG. 15A) are assigned relatively higher weights compared to locations associated with the no diffractions. In an embodiment, the weights may be a positive real number (e.g., 0, 0.1, 0.2, 0.3, 0.4, 1, 2, etc.) or a positive integer (e.g., 1).

Figure 16A:
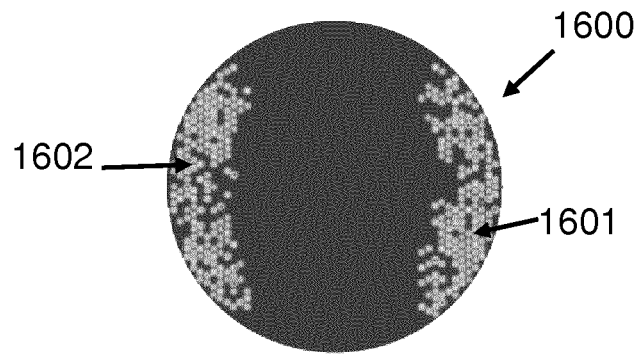
FIG. 16A illustrate an example illumination pupil, according an embodiment.
Figure 16B:
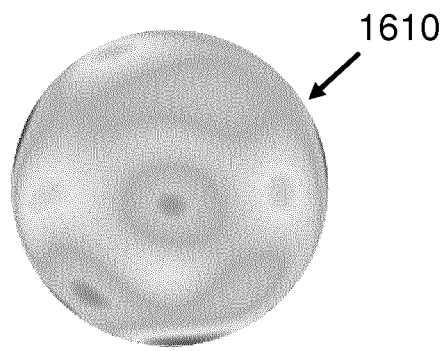
FIGS. 16B and 16C illustrate an example wavefronts associated with the illumination pupil of FIG. 16A, according an embodiment.
Figure 16C:
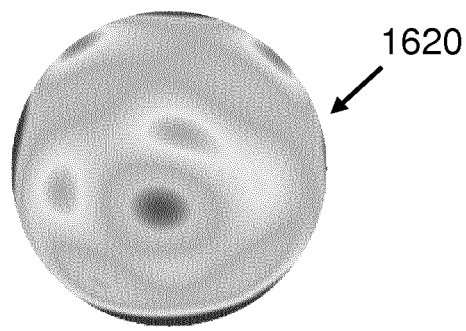

As mentioned earlier, different scanners may generate different wavefronts. For example, referring to FIG. 16A-16C, an illumination pattern 1600 comprising diffraction orders at locations (or portions) 1601 and 1602 of a pupil may result in a first wavefront 1610 on a first scanner and a second wavefront 1620 on a second scanner. Regardless, the pupil weight map (e.g., 1302) will assign weights to wavefronts in a similar manner. For example, a wavefront portion associated with locations 1601 and 1602 will be assigned higher weight relative to other locations (or portions) of the wavefront (e.g., 1610 and 1620). Hence, even if the wavefronts 1610 and 1620 do not particularly match a reference or ideal wavefront, appropriate lens adjustments may be determined for each scanner.

In an embodiment, the diffraction intensity pattern is a linear combination of Zernike polynomials describing the weight. In an embodiment, the weights of the pupil weight map are based on Zernike sensitivities, a given Zernike sensitivity being a partial derivative of the performance metric with respect to a given Zernike polynomial. For example, partial derivative of a SMO merit function (e.g., Eq 1 discussed later in the disclosure) with respect to the Zernike polynomial.

Figure 17:
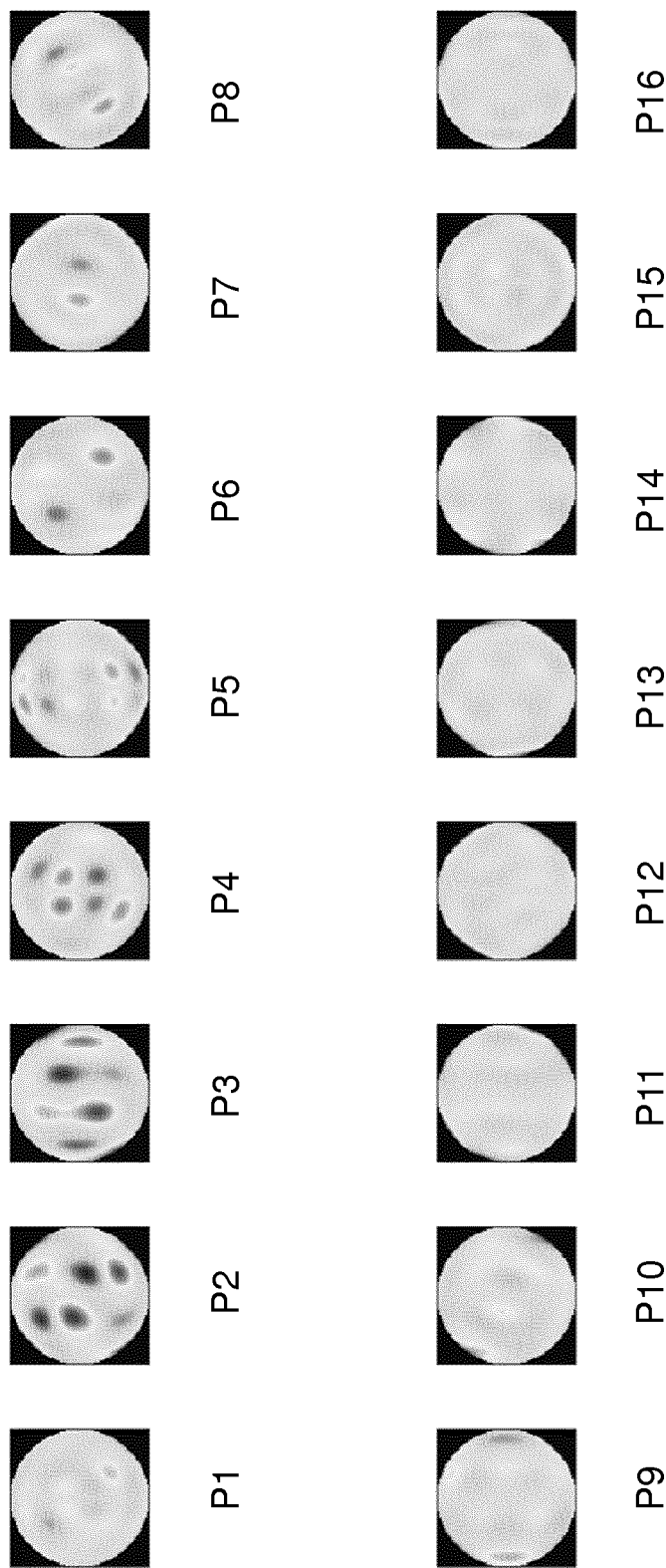
FIG. 17 illustrates example principal components obtained from a principal component analysis, according an embodiment.

In an embodiment, a combination of Zernike polynomials are obtained via PCA. In an embodiment, the pupil weight map may be a PCA component or may be derived from a sum of each of the PCA component. For example, FIG. 17 illustrates example PCA components P1-P17 that explain most of the variations in imaging performance related to wavefronts and/or aberrations. Then, a pupil weight map may be a PCA component P1, P2, or any other PCA component, or a sum of PCAs P1-P17.

In an embodiment, the weights of the pupil weight map are based on principal component analysis (PCA) of a set of wavefronts, the set of wavefronts obtained from one or more scanners used in the patterning process. In an embodiment, the weights of the pupil weight map are based on a sensitivity of a principal component of a set of wavefronts determined with respect to the performance metric.

Thus, during an optimization process (e.g., employing DLM), relevant portions of the wavefront (e.g., pixels having relatively higher impact on the performance metric) are assigned higher importance allowing the determination of lens adjustments or corrections to compensate for effects due to relevant wavefront portions. Such lens adjustments further improve the imaging performance (e.g., minimum defects, better EPE, overlay performance, etc.). Hence, even if a given wavefront of any scanner does not match or closely match an ideal wavefront, the scanner performance can still be improved to effectively meet the performance specification (e.g., EPE and overlay).

Furthermore, the diffraction pattern may change during patterning process due to various reasons such as heat transient, drift, etc. The changed diffraction pattern will be reflected in the pupil weight map 1302, thereby the determined lens adjustments will automatically compensate for dynamic changes in diffraction pattern.

In earlier discussed embodiments related to the wavefront offset solution, the pupil weight map (e.g., 1302, 1400, etc.) are not used. Instead, the wavefront offset solution modifies the wavefront 1520 to closely match a reference wavefront (not shown) of a reference scanner. For example, a center and/or edge of the wavefront 1520 may be modified to match the reference wavefront, which will result in matching performance of the reference apparatus. Thus, establishing a consistent imaging performance between different scanners used in a chip manufacturing.

Procedure P1303 involves determining, via executing the lens model 1301 using the pupil weight map 1302 and the exposure wavefront, a lens adjustment parameter value 1303 such that a lens merit function (e.g., Eq. 2 including a lithographic metric discussed later in the disclosure) associated with the lens model is improved (in an embodiment, minimized). In an embodiment, the lens metric function is a function of the pupil weight map 1302 (herein implemented as the lithographic metric). It is via such lithographic metric, dynamic conditions (e.g., changes in aberration, heat transient, etc.) associated with the aberration wavefront can be accounted for during the patterning process adjustments. Comparatively, the wavefront offset solution (e.g., LFP based wavefront matching to a reference wavefront) is a static approach and may not account for the dynamic conditions.

In an embodiment, the aberration wavefront parameter are associated with an offset, a tilt, a curvature, and/or up to and including $3^{rd}$ order or higher order parameters associated with Zernike polynomials. Then, determined the adjustment parameter values are values associated with offset, tilt, curvature, etc.

In an embodiment, the procedure P1303 of the determining of the lens adjustment parameter is an iterative process. An example of the iterative process involves procedures P1311-P1319 illustrated in FIG. 13B.

Procedure P1311 involves executing the lens model 1301 using, as input, the pupil weight map 1302 and the given exposure wavefront to generate the aberration wavefront.

Procedure P1313 involves determining, based on the aberration wavefront, the edge placement error and the pattern placement error associated with one or more portions of the aberration wavefront. In an embodiment, the pattern placement error is a mutual shift of features in a layer, the mutual shift being relative to a design layout associated with the substrate. For example, one or more contact holes are shifted to left with respect to a reference position (e.g., associated with a design layout) on the substrate In an embodiment, the aberration wavefront is used in a patterning process simulation to determine a substrate pattern. In an embodiment, the substrate pattern may be a printed pattern on the substrate imaged using the aberration wavefront. In an embodiment, the EPE is determined based on edge placement gauges (or measurement locations) placed along a contour of the substrate pattern and measuring a distance between an EP gauge and a reference contour or a reference point. In an embodiment, the distance may be measured along cut lines drawn in a normal direction to the contour. Further, the PPE may be determined based on a location of the substrate pattern with respect to a desired location or reference location. In an embodiment, the reference location refers to location of another substrate pattern on a different layer.

Procedure P1315 involves evaluating the performance metric using the edge placement error and the pattern placement error. In an embodiment, the performance metric is associated with sensitivity of the aberration wavefront which eventually results in EPE and PPE.

In an embodiment, the performance metric (e.g., merit function of eq.1 below) is a function of higher order (e.g., at least $2^{nd}$ order, the $2^{nd}$ order is also known as a root mean square) of the edge placement error and/or e.g., at least $2^{nd}$ order of the pattern placement error. In embodiment, the higher order (e.g., fourth order) of EPE and PPE stresses weaker points (e.g., resulting in defects). In an equation below, the co-efficient "c" and "PPE" help balance EPE against overlay associated with a desired pattern to be printed on the substrate.

$$\text{Merit function} = \sum_{cutlines} \sum_{\substack{Focus \\ dose}} EPE^4 + c \cdot PPE^4 \qquad \text{(Eq. 1)}$$

Procedure P1317 involves adjusting, via lens actuator adjustment, the aberration wavefront parameter based on a gradient of the performance metric such that the performance metric is improved. For example, the gradient may be d(merit function)/d(lens adjustment parameter) and lens adjustments may be determined such that the gradient guides the cost function to be minimized. In an embodiment, the lens adjustment is such that the lithographic metric associated with DLM is minimized.

Procedure P1319 involves determining whether the merit function is reduced (in an embodiment, minimized). If not reduced, the procedure continues the simulation of DLM e.g., at procedure P1311. In an embodiment, once the merit function is minimized, the procedure P1303 ends and the determined lens adjustment parameters values can be further used in the patterning process. As mentioned earlier, the lens adjustment parameters and values thereof are associated with an offset, a tilt and/or a curvature of the aberration patterns.

Procedure P1305 involves adjusting, via a patterning process simulation using the aberration wavefront associated with the lens adjustment parameter value, the weights of the pupil weight map such that the performance metric is improved, the performance metric being a function of an edge placement error and a pattern placement error associated with a desired pattern to be printed on a substrate.

The adjusted weights 1305 and associated aberration wavefront can be further converted to lens adjustments. For example, the method 1300 may further comprise procedure P1307 that involves converting, via the lens model 1301, the wavefront parameters (e.g., obtained in procedure P1317 or P1305) to the lens adjustment parameter values 1303. Further, procedure P1309 involves actuating the optical system of a patterning apparatus based on the lens adjustment parameter values 1303.

Furthermore, the method 1300 may further include deweighting or upweighting (e.g., decreasing or increasing pixel values of the given aberration wavefront) a region of the illumination pupil via the pupil weight map 1302; executing the lens model 1301 using the deweighted pupil weight map or the upweighted pupil weight map; and determining another lens adjustment parameter values associated with an optical system of the patterning apparatus using the deweighted pupil map and the exposure wavefront associated therewith so that the performance metric is minimized. In an embodiment, the deweighted region is associated with the aberration wavefront that is correctable via a wavefront manipulator of the patterning apparatus during the patterning process.

Figure 18:
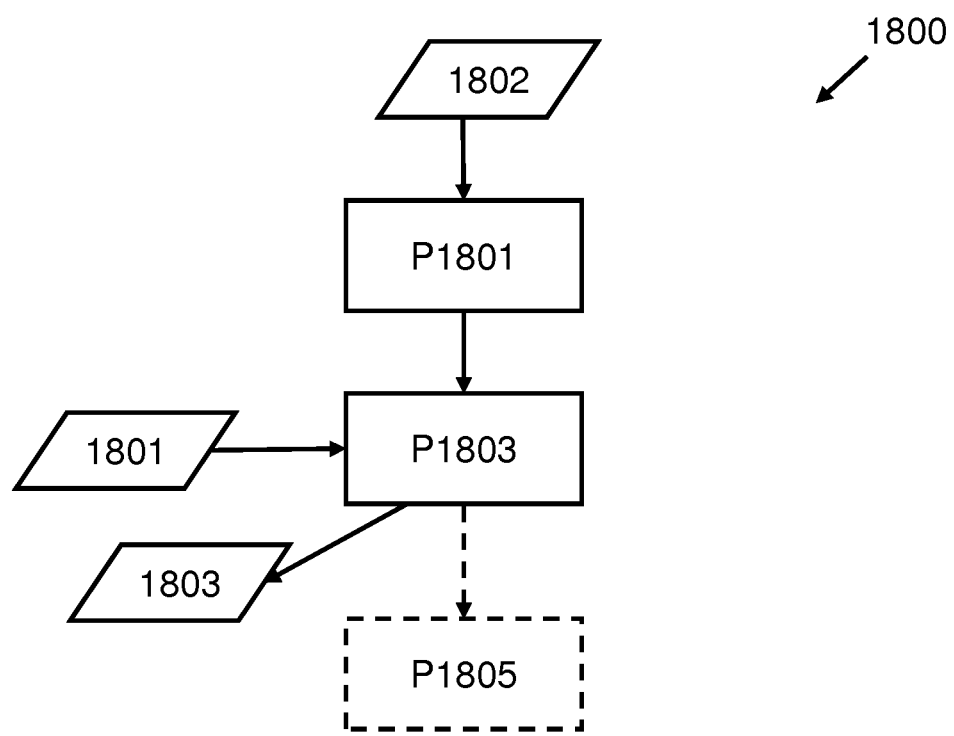
FIG. 18 is a flow chart of method for determining lens adjustments for a patterning apparatus, according an embodiment.

FIG. 18 describes a method 1800 for determining lens adjustments for a patterning apparatus. In an embodiment, the lens adjustment is a sub-space of a lens knob space. In an embodiment, the lens knob space refers to the degrees of freedom (e.g., orientations of an array of mirrors) associated with projection system of the patterning apparatus. In an embodiment, an aberration correction is in the space of lens knob corrections, which represent some linear combinations of Zernikes used in the lens model (also referred as a lens model (DLM)). In an embodiment, the impact evaluation associated with the lens knob correction may contain impact from (higher order) Zernikes not contained in the lens model, but affected by the lens knob. In an embodiment, such lens adjustment is determined based on a lithographic metric configured to drive the optimization process to a wavefront target. The method 1800 is further discussed in detail below.

Procedure P1801 involves obtaining a lens merit function associated with the lens model of the patterning apparatus and a wavefront target 1802. The wavefront target 1802 refers to a quality value or a reference value assigned to a residual aberration wavefront associated with the patterning apparatus. The wavefront target acts as a guide to determine a sub-space from the lens knob space. The lens knob space is a space associated with degrees of freedom (DOF) of a lens of the patterning process. For example, a lens knob space may include 36 degrees of freedom associated with different orientation (e.g., tilt, curvature, rotation, etc.) of an array of mirrors. In an embodiment, potential orientations such as the tilt, curvature, rotation, etc. are also referred as the lens adjustment parameters.

In an embodiment, the lens merit function is determined based on a lithographic merit function (e.g., Eq. 1) associated with an aspect (e.g., SMO) of the patterning process. In an embodiment, the lithographic merit function includes an edge placement error (EPE) associated with a pattern to be imaged on a substrate; and a pattern placement error (PPE). The pattern placement error being a mutual shift of features in a layer, the mutual shift being relative to a reference position associated with the substrate.

In an embodiment, the lithographic merit function associated with the SMO and/or the DLM is a mountain-like landscape of lithographic merit function values determined with respect to parameters of a patterning process (e.g., dose, focus, DOF of the lens, etc.).

The mountain landscape may have several minima points (e.g., local minima and global minima) that represent minimum value around a particular region of the landscape. In an embodiment, the global minimum of the merit function may be outside an origin associated with the lens knob space, for example global minima associated with mask 3D offsets. Then, it may be desired to direct the DLM to a desired working point (e.g., a minimum value of lithographic metric) associated with the lens knob space. Note that in lens knob space the correction capability is in principle 100% (full correction, no parasitic effects). In the present disclosure, directing of the lens model to the desired point can be done per scanner (per point in time) through a Wavefront Offset, but due to 100% correctability the same can be done through a Wavefront target 1802 for all scanners (and at any point time). In an embodiment, the desired working point is associated with one or more points at or around the global minima of the lithographic merit function.

Further, procedure P1803 involves determining, via a lens model 1801 of the patterning apparatus using the lens merit function and wavefront target 1302 (e.g., the quality value associated with the residual wavefront), the lens knob setting 1803 from the lens knob space of the patterning apparatus based on minimizing the lens merit function, the lens merit function comprising a lithographic metric associated with the residual aberration wavefront. In an embodiment, the lens merit function is determined based on a lithographic merit function (e.g., comprising EPE and PPE). An example of a wavefront target driving the lithographic metric of the DLM to determine a lens knob sub-space is illustrated and discussed with respect to FIG. 19 later in the disclosure. In an embodiment, lithographic metric is a function of sensitivities of the residual aberration wavefront and measured wavefront associated with a given lens actuator setting, the sensitivities being determined with respect to the merit function of the patterning process.

In an embodiment, the determining of the lens knob setting 1803 is an iterative process. An iteration involves executing the lens model using a sub-set of lens knob space to determine the aberration wavefront associated with an optical system of the patterning apparatus; determining, using the determined aberration wavefront, the lithographic metric and the lens merit function; determining a gradient of the lens merit function and/or the lithographic metric with respect to the lens knob space; and selecting, based on the gradient of the lens merit function and/or the lithographic metric, another subset of the lens knob space that causes the difference to be reduced in a subsequent iteration. The iterations may continue till the lens merit function and/or the lithographic metric is minimized or convergence (e.g., no further improvement in merit function) is achieved.

In an embodiment, the lithographic metric is a sum of a product of a sensitivity of a lens knob setting and a given wavefront associated with the patterning apparatus. In an embodiment, the aberration wavefront is represented by a Zernike polynomial. In an embodiment, the lithographic metric is a function of a plurality of Zernike polynomials, the function mimicking effects of changes to the lens knob setting 1803 of the patterning apparatus. In an embodiment, the Zernike polynomials are weighted according to a correction potential of the patterning apparatus.

In an embodiment, the goal of the simulation (e.g., involving executing DLM) is to minimize the following expression (Eq. 2), where $ZPC_i$ represents a reference wavefront and $(Z_i - ZPC_i)$ represents the Zernike process offset applied in the Wavefront offset solution to obtain an optimized wavefront; and where index i is a Zernike index number. According to the present disclosure, the image tuning further includes lithographic metric and the wavefront target 1802 that drives the DLM in selecting of knob sub-space in a lens knob space.

$$\text{minimize} \left( \sum_i (Z_i - ZPC_i)^2 + (\text{lithographic metric} - \text{wavefront target})^2 \right) \quad \text{(Eq. 2)}$$

$$\text{where lithographic metric} = \sum_i s_i \cdot Z_i$$

In an embodiment, based on an imaging and/or overlay performance (e.g., EPE and/or PPE), some directions in lens knob space may be more problematic than others. In this case, a lithographic metric LiMe guides the DLM (via DLM's merit function) regarding what the problematic directions. In an embodiment, one lithometric LiMe defines a hyperplane in lens knob space. If N=number of lens knobs, then N LiMe's define a point in lens knob space with a hyerspherical merit function around it, and N weighted LiMe's define a hyperellipsoid as a merit function to benefit some directions compared to other directions. An M (M=N–P) dimensional hyperellipsoid has P dimensions that are infinite, indicating these P dimensions of the lens knob space can be considered irrelevant to imaging/overlay performance.

In an embodiment, the hyperellipsoid (e.g. a cigar shape in 3 dimensional space) is defined by fitting a hyperellipsoid function to the imaging or overlay merit function around a desired working point (e.g., a global minima of the lithographic merit function). In an embodiment, the fitting process employs PCA analysis to identify combinations of fitting variables (e.g., lens knob adjustment parameters) that explain prevalent contributors of the merit function around the desired working point. In an embodiment, for robustness, only few PCA components may be selected. In an embodiment, a PCA component becomes a lithographic metric. For example, first 10 PCA components (e.g., P1-P10 out of 16 components in FIG. 17) may be considered as 10 different lithographic metric.

In an embodiment, the fitted function cannot represent a random shape e.g. a banana shape, because the DLM may not be configured to deal with non-linear behavior. In an embodiment, such restriction may be applied due to timing constraint for the DLM solution associated with a scanner throughput and a net lot overhead.

In an embodiment, the LiMe (e.g., the cigar shaped hyperellipsoid) fitting may be limited to practical aberration magnitudes. For example, apart from limiting the fitting along a lens knob axis, a weight of larger aberration contents may be reduced, e.g. radially in lens knob space. Further, some azimuthal angles in lens knob space may be more important than others, because actual scanner aberrations (LFP, MH, and potentially others) occur more in certain parts of the lens knob sub-space than in others. There may even be an offset of average actual lens aberration state with respect to a zeroth origin (e.g. systematic lens fingerprint, offset in slit only).

Figure 19:
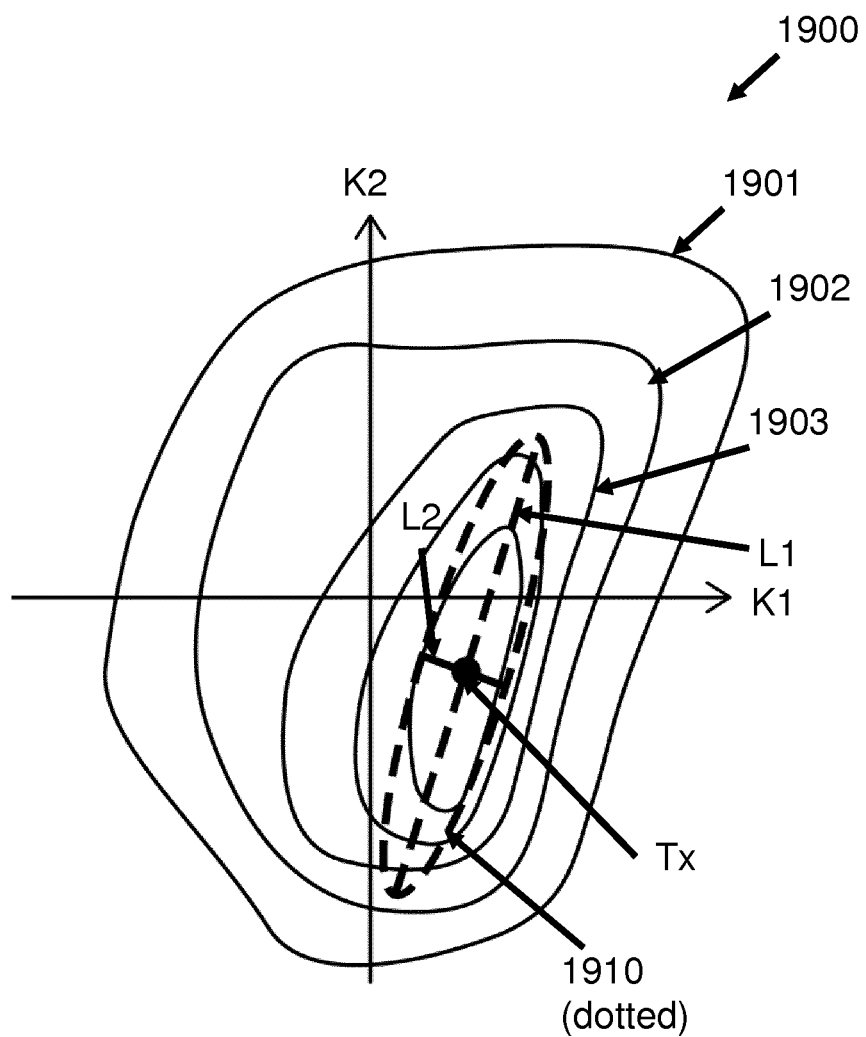
FIG. 19 is an example of a wavefront target driving the lithographic metric of a lens model to determine a lens knob sub-space, according an embodiment.

In FIG. 19, a plot 1900 illustrates an example of determining lens knob setting (e.g., lens knob K1 and lens knob K2) based on lithographic metrics L1 and L2 and a wavefront target Tx. In an embodiment, the lithographic metric L1 correspond to a first wavefront (e.g., a first PCA component) and the metric L2 correspond to a second wavefront (e.g., PCA component). Then, based on a sensitivity of the lens knob settings of knobs K1 and K2, a sub-space 1910 of the lens knob space K1 and K2 may be identified. For example, the lithographic metric L1 is reduced (in an embodiment, minimized) when the lens knob sub-space is along or close to line of the lithographic metric L1, while reducing (in an embodiment, minimizing) a distance from the wavefront target. Similarly, the lithographic metric L2 in combination with wavefront target Tx guides the selection of appropriate sub-space from the lens knob space of K1 and K2.

The sub-space 1910 is an acceptable set of values of the knob setting of K1 and K2. The sub-space 1910 is considered within an acceptable range of the wavefront target Tx. In an embodiment, the acceptable range around the wavefront target may be defined as a function of a distance of any point in the sub-space from the wavefront target. Closer the sub-space to the wavefront target, better will be the imaging and/or overlay performance. For example, the values of sub-space defined by region between 1901 and 1902 are farthest away from the wavefront target and not acceptable.

In an embodiment, the knobs K1 and K2 are lens adjustment parameter such as a tilt (curvature, rotation, or other lens related parameter) of a first lens and the second lens, respectively.

In an embodiment, the lithographic metric represents a physical quantity associated with a pattern imaged, via the patterning apparatus, on a substrate. In an embodiment, the lithographic metric represents at least one of the following physical quantity: a pattern shift associated with a printed pattern with respect to a desired position of a desired pattern, a focus shift of the patterning apparatus with respect to the substrate, the focus shift containing astigmatism offset associated with the patterning apparatus, an asymmetry in critical dimension at a top and a bottom of the printed pattern, and/or an edge placement error associated with the printed pattern.

In an embodiment, the procedure P1303 of determining the lens knob setting 1803 involves simulating the lens model such that a difference between the lithographic metric and the wavefront target 1802 is reduced.

In an embodiment, the procedure P1803 of the determining the lens knob setting 1803 involves computing the sensitivities of the residual aberration wavefront and/or the measured wavefront associated with the lens actuator space; and determining the lens knob setting as a sub-set of lens knob space based on the sensitivities such that the sub-set of lens actuator space minimizes the lithographic metric, for example using equation Eq. 2 herein.

In an embodiment, the procedure P1803 the determining of the lens knob setting 1803 involves reducing weight of one or more Zernike polynomials associated with relatively higher aberration content.

In an embodiment, the determining the lens knob setting 1803 involves determining a sub-set of the lens knob space to balance scanner aberrations due to lens fingerprint, and/or mirror heating, where the balancing is based on adjusting weights of the Zernike polynomials.

Upon optimization based on lithographic metric discussed above, the DLM outputs the lens knob setting 1803 includes values associated with an offset, a tilt, a curvature, and/or up to and including $3^{rd}$ order parameters associated with Zernike polynomials. In an embodiment, parameters higher than $3^{rd}$ oder may also be considered during the optimization process. In an embodiment, procedure P1805 involves adjusting the optical system based on the lens knob setting 1803. As a result, the patterning apparatus using the optical system improves the yield of the patterning process.

In an embodiment, the optimization of a patterning process may be performed in following manner: (i) a pupil optimization (e.g., using FlexPupil) can be performed to tune overlay performance, without losing too much contrast of a substrate or imaging performance of the patterning apparatus. For example, the pupil shape and intensity may be adjusted so that the contrast loss or EPE is minimized. Then, (ii) the lithographic metric based merit function (e.g., used in lens model 1301) may be used for tuning one or more critical layer of a substrate, rather than using the default lens merit function. For example, the lithographic metric can be used for a field size scaling in an image tuner sub-recipe for non-full fields, thus optimizing only those slit points that do matter.

Figure 20:
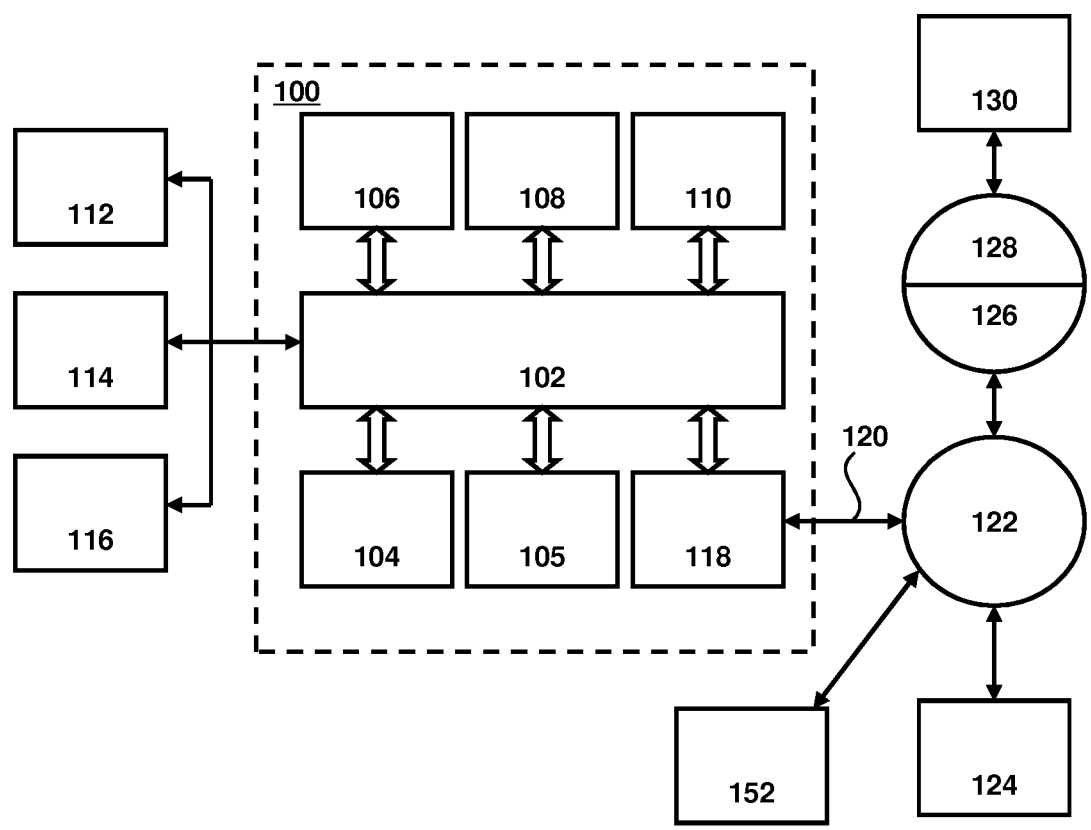
FIG. 20 is a block diagram of an example computer system, according an embodiment.

FIG. 20 is a block diagram that illustrates a computer system 100 which can assist in implementing the methods, flows or the apparatus disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hardwired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data (from database 152), including program code, through the network(s), network link 120, and communication interface 118. In the Internet example, a server 130 might transmit a requested code for an application program through Internet 128, ISP 126, local network 122 and communication interface 118. One such downloaded application may provide all or part of a method described herein, for example. The received code may be executed by processor 104 as it is received, and/or stored in storage device 110, or other non-volatile storage for later execution. In this manner, computer system 100 may obtain application code in the form of a carrier wave.

Figure 21:
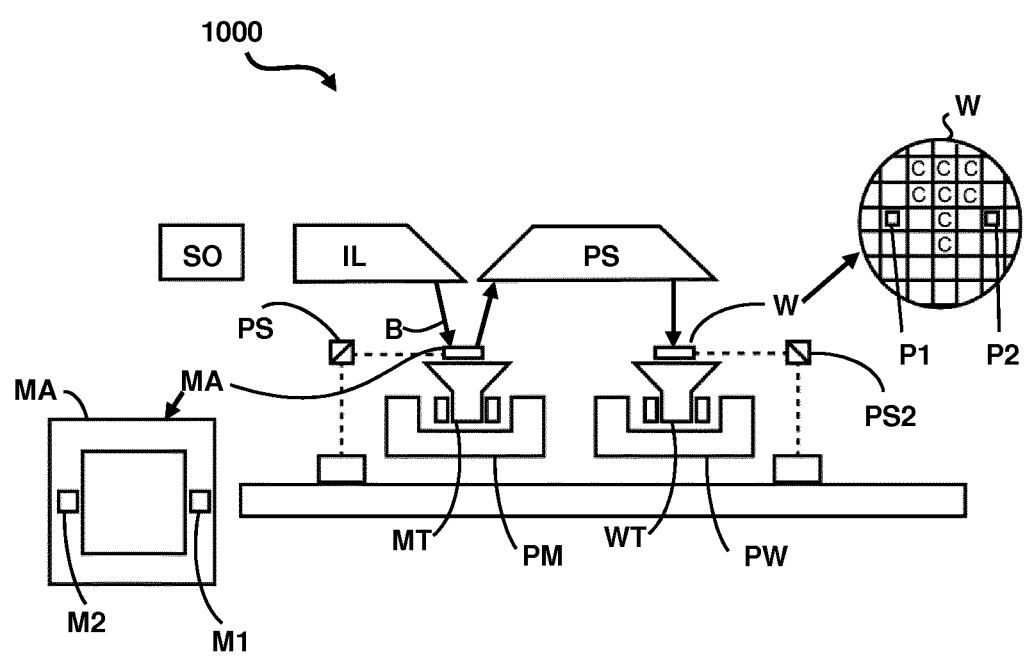
FIG. 21 is a schematic diagram of another lithographic projection apparatus, according to an embodiment.

Referring to FIG. 21, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 21, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-) magnification and image reversal characteristics of the projection system PS.

3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 22:
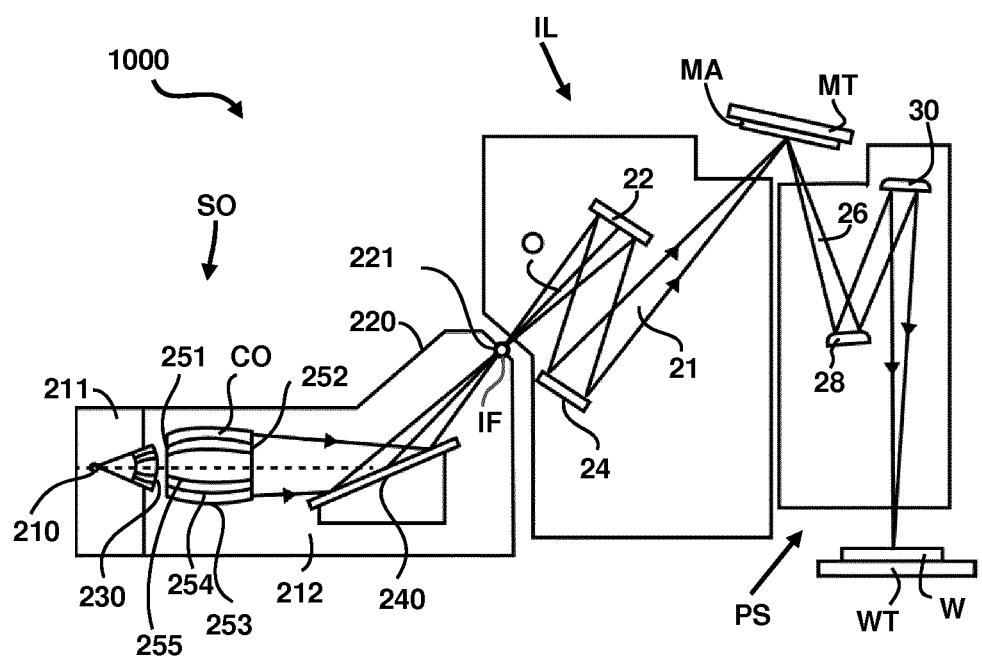
FIG. 22 is a view of the apparatus in FIG. 1 for an extreme ultra violet scanner, according to an embodiment.

FIG. 22 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 22.

Collector optic CO, as illustrated in FIG. 22, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 23:
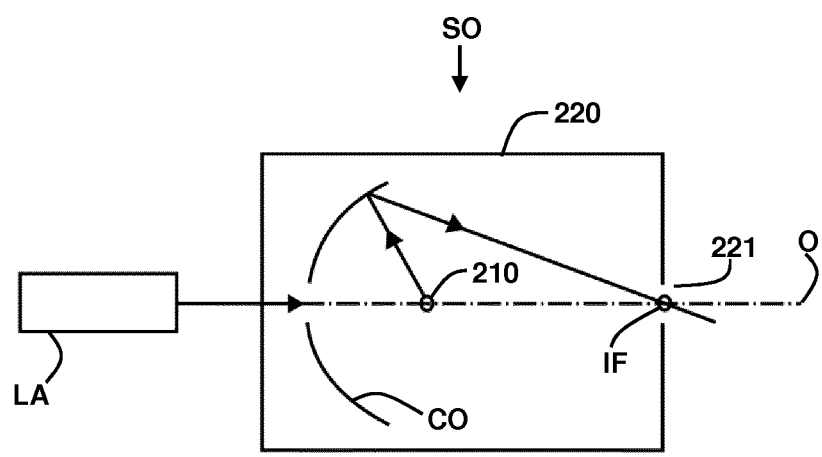
FIG. 23 is a more detailed view of the source collector module SO of the apparatus of FIG. 21 and FIG. 22, according to an embodiment.

Alternatively, the source collector module SO may be part of an LPP radiation system as shown in FIG. 23. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method for determining a wavefront of a patterning apparatus of a patterning process, the method comprising:
   obtaining (i) a reference performance of a reference apparatus, (ii) a lens model of a patterning apparatus configured to convert a wavefront parameter of a wavefront to actuator movements, and (iii) a lens fingerprint of a tuning scanner; and
   determining, via a processor, the wavefront parameter based on the lens fingerprint of the tuning scanner, the lens model, and a cost function, wherein the cost function is a difference between the reference performance and a tuning scanner performance.

2. The method of clause 1, wherein the determining of the wavefront parameter is an iterative process, an iteration comprising:
generating, via simulation of the lens model using the lens fingerprint of the tuning scanner, an initial wavefront;
determining a substrate pattern from the initial wavefront;
determining the tuning performance from the substrate pattern;
evaluating the cost function based on the tuning performance and the reference performance; and
adjusting the wavefront parameter of the initial wavefront based on a gradient of the cost function, such that the cost function is improved.

3. The method of any of clauses 1-2, wherein the wavefront comprises the lens fingerprint of the tuning scanner and a performance fingerprint of the lens model.

4. The method of clause 3, wherein the adjusting of the wavefront parameter is further based on the performance fingerprint of the lens model.

5. The method of any of clauses 2-4, wherein determining the substrate pattern comprises simulation of a process model of the patterning process using the initial wavefront or the adjusted wavefront.

6. The method of clause 5, wherein the process model comprises:
a mask model configured to predict a mask image based from a mask pattern;
an optical model configured to predict an aerial image from the mask pattern; and/or
a resist model configured to predict a resist image from the aerial image.

7. The method of any of clauses 2-4, wherein determining the substrate pattern comprises:
receiving, via a metrology tool, substrate measurements of an exposed substrate, wherein the substrate is exposed using the initial wavefront or the adjusted wavefront; and
determining the substrate pattern based on contour extraction from the substrate measurement.

8. The method of any of clauses 1-7, wherein the cost function is minimized or maximized.

9. The method of any of clauses 1-8, wherein the cost function is an edge placement error, CD and/or an error within a tolerance band of edge placement.

10. The method of any of clauses 1-9, wherein the lens model includes constraints related to a correction limitation of a tuning scanner corresponding to a wavefront parameter.

11. The method of any of clauses 1-10, wherein the wavefront parameter comprises an offset, a tilt, a curvature, and/or up to third order parameters associated with an optical system of the patterning apparatus.

12. The method of any of clauses 1-11, wherein the wavefront is a through-slit wavefront.

13. The method of clause 12, wherein the slit has a rectangular shape.

14. The method of any of clauses 1-13, wherein the wavefront is represented by Zernike polynomial across a slit.

15. The method of clause 14, wherein the wavefront parameter is expressed as a vector of Zernike coefficients.

16. The method of any of clauses 1-15, further comprising:
converting, via the lens model, the wavefront parameters to the actuator movements; and
actuating the optical system of the tuning scanner based on the actuator movements.

17. The method of any of clauses 1-16, wherein the reference performance and the tuning scanner performance are expressed in terms of a contour of a pattern and/or a critical dimension.

18. A method for determining a wavefront of a tuning scanner with respect to a reference apparatus, the method comprising:
obtaining (i) a reference performance of the reference apparatus corresponding to a reference lens fingerprint, and (ii) a lens fingerprint of a tuning scanner;
determining, via a processor, a wavefront parameter of the tuning scanner based on the lens fingerprint and a cost function, wherein the cost function computes a difference between the reference performance and a tuning scanner performance.

19. The method of clause 18, wherein obtaining the reference performance comprises:
measuring the reference lens fingerprint of the reference apparatus;
generating, via simulation of a process model, a reference pattern based on the measured lens fingerprint of the reference apparatus and a patterning device pattern corresponding to a design layout; and
determining the reference performance based on a contour of the reference pattern.

20. The method of any of clauses 18-19, wherein the determining of the wavefront parameter is an iterative process, an iteration comprising:
determining via simulation of the process model, a substrate pattern using a patterning device pattern and a lens fingerprint of the tuning scanner;
determining the tuning scanner performance based on the substrate pattern;
evaluating the cost function based on the tuning scanner performance and the reference performance; and
adjusting the wavefront parameter based on a gradient of the cost function with respect to the wavefront parameter, such that the cost function is improved.

21. The method of clause 20, wherein the patterning device pattern is generated via simulation of a mask optimization or source mask optimization process, wherein a lens aberration model is included in the process model.

22. The method of any of clauses 19-21, wherein the reference performance and tuning scanner performance is expressed in terms of a contour of a pattern, and/or a critical dimension.

23. The method of any of clauses 19-22, wherein the reference apparatus comprises:
a scanner of a wafer fabrication facility;
an ideal scanner having no aberrations; and/or
an aberration compensated scanner that is compensated for average aberration of a plurality of scanners within the wafer fabrication facility.

24. The method of any of clauses 18-23, wherein the cost function is an edge placement error, CD and/or an error within a tolerance band of edge placement.

25. The method of any of clauses 18-24, wherein the wavefront parameter comprises an offset, a tilt, a curvature, and/or up to and including third order parameters associated with an optical system of the patterning apparatus.

26. A method of wavefront matching of a tuning scanner for a patterning process, the method comprising:
obtaining (i) a plurality of hot spot patterns corresponding to a layer of a substrate, (ii) a plurality of wavefronts corresponding to the plurality of hot spot patterns, and (iii) a lens fingerprint of a tuning scanner;

determining, via simulation of a patterning process using the lens fingerprint, a tuning scanner performance; and selecting a wavefront parameter for the tuning scanner from the plurality of wavefronts based on comparison between the tuning scanner performance and a reference performance.

27. The method of clause 26, wherein one or more of the plurality of wavefronts include optimized wavefront parameters.

28. The method of any of clauses 26-27, wherein the one or more of the plurality of wavefronts is associated with a particular reference performance.

29. A method of determining a lens adjustment parameter value for a patterning apparatus used in a patterning process, the method comprising:

obtaining (i) a pupil weight map associated with an exposure wavefront, wherein weights of the pupil weight map are associated with a performance metric of the patterning apparatus, and (ii) a lens model of a patterning apparatus, the lens model configured to convert an aberration wavefront parameter associated with the exposure wavefront to a lens adjustment parameter;

determining, via executing the lens model using the pupil weight map and the exposure wavefront, a lens adjustment parameter value such that a lens model merit function associated with the lens model is improved, wherein the lens model merit function is a function of the pupil weight map; and adjusting, via simulating a patterning process using the aberration wavefront associated with the lens adjustment parameter value, the weights of the pupil weight map such that the performance metric of the patterning process is improved, the performance metric being a function of an edge placement error and a pattern placement error associated with a pattern to be printed on a substrate.

30. The method of clause 29, wherein the pupil weight map is a pixelated image, wherein a given pixel of the pixelated image is assigned a weight based on an impact of change in the given pixel value on the performance metric.

31. The method of any of clauses 29-30, wherein the weights of the pupil weight map are based on diffraction information associated with an illumination pupil, wherein the diffraction information comprises diffraction orders and/or diffraction intensity pattern.

32. The method of clause 30, wherein a portion of the pupil weight map associated with a diffraction order is assigned a weight 1 and another portion not associated with the diffraction order is assigned a weight 0.

33. The method of clause 30, wherein the diffraction intensity pattern is a linear combination of Zernike polynomials describing the weight.

34. The method of any of clauses 29-34, wherein the weights of the pupil weight map are based on Zernike sensitivities, a given Zernike sensitivity being a partial derivative of the performance metric with respect to a given Zernike polynomial.

35. The method of any of clauses 29-34, wherein the weights of the pupil weight map are based on principal component analysis (PCA) of a set of wavefronts, the set of wavefronts obtained from one or more scanners used in the patterning process.

36. The method of clause 35, wherein the weights of the pupil weight map are based on a sensitivity of a principal component of the set of wavefronts, the sensitivity being determined with respect to the performance metric.

37. The method of clause 36, wherein the weights of the pupil weight map are based on a mini-batch algorithm.

38. The method of any of clauses 29-37, wherein the determining of the lens adjustment parameter is an iterative process, an iteration comprising:

executing the lens model using the pupil weight map and the given exposure wavefront to generate the aberration wavefront;

determining, based on the aberration wavefront, the edge placement error and the pattern placement error associated with one or more portions of the aberration wavefront;

evaluating the performance metric using the edge placement error and the pattern placement error; and adjusting, via lens actuator adjustment, the aberration wavefront parameter based on a gradient of the performance metric such that the performance metric is improved.

39. The method of any of clauses 29-32, further comprising:

deweighting or upweighting a region of the illumination pupil via the pupil weight map;

executing the lens model using the deweighted pupil weight map or the upweighted pupil weight map; and determining another lens adjustment parameter values associated with the aberration wavefront using the deweighted pupil map or the upweighted pupil map, and the exposure wavefront associated therewith so that the performance metric is minimized.

40. The method of any of clauses 29-33, wherein the deweighted region is associated with the aberration wavefront that is correctable via a wavefront manipulator of the patterning apparatus during the patterning process.

41. The method of any of clauses 29-34, wherein the lens model merit function is minimized.

42. The method of any of clauses 29-35, wherein the lens model includes constraints related to correction limitations of the patterning apparatus corresponding to the aberration wavefront.

43. The method of any of clauses 29-37, wherein the exposure wavefront is a through-slit wavefront.

44. The method of clause 38, wherein the slit has a rectangular shape.

45. The method of clause 38, wherein the slit has a curved shape.

46. The method of any of clauses 29-36, wherein the aberration wavefront parameter are associated with an offset, a tilt, a curvature, and/or up to and including $3^{rd}$ order parameters or higher than $3^{rd}$ order associated with Zernike polynomials.

47. The method of any of clauses 29-42, further comprising:

converting, via the lens model, the aberration wavefront parameter to the lens adjustment parameter; and actuating the optical system of a patterning apparatus based on the lens adjustment parameter.

48. A method of determining lens actuator setting for a patterning apparatus, the method comprising:

obtaining a lens merit function and a reference value assigned to a residual aberration wavefront associated with the patterning apparatus; and determining, via a lens model of the patterning apparatus using the lens merit function and the reference value, the lens actuator setting from the lens actuator space of the patterning apparatus based on minimizing the lens merit function, the lens merit function comprising a lithographic metric associated with the residual aberration wavefront.

49. The method of clause 48, wherein the lens merit function is determined based on a lithographic merit function, the lithographic merit function comprising:

an edge placement error associated with a pattern to be imaged on a substrate; and a pattern placement error, the pattern placement error being a mutual shift of features in a layer, the mutual shift being relative to a reference position on the substrate.

50. The method of any of clauses 48-49, wherein the lithographic metric is a function of at least $2^{nd}$ order of the edge placement error (EPE) and/or at least $2^{nd}$ order of the pattern placement error (PPE), wherein the EPE and/or the PPE are caused due to changes in the lens actuator setting.

51. The method of any of clauses 48-50, wherein the reference value is associated with one or more points at or around the global minima of the lithographic merit function.

52. The method of any of clauses 48-51, wherein the lithographic metric defines a hyperplane in the lens actuator space, the hyperplane providing a relationship between the lithographic metric and at least two actuator settings of the lens actuator space.

53. The method of any of clauses 48-52, wherein the determining of the lens actuator setting is an iterative process, an iteration comprises:

executing the lens model using a sub-set of lens actuator space to determine the aberration wavefront;

determining, using the determined aberration wavefront, the lithographic metric and the lens merit function;

determining a gradient of the lens merit function and/or the lithographic metric with respect to the lens actuator space; and selecting, based on the gradient of the lens merit function and/or the lithographic metric, another subset of the lens actuator space that causes the lens merit function and/or the lithographic metric to be reduced in a subsequent iteration.

54. The method of any of clauses 46-53, wherein the lithographic metric is a function of sensitivities of the residual aberration wavefront and/or a measured wavefront associated with a given lens actuator setting, the sensitivities being determined with respect to a merit function of the patterning process.

55. The method of clause 54, wherein the determining the lens actuator setting comprises:

computing in the sensitivities of the aberration wavefront and/or the measured wavefront associated with the lens actuator space; and determining the lens actuator setting as a sub-set of lens actuator space based on the sensitivities such that the sub-set of lens actuator space minimizes the lithographic metric.

56. The method of any of clauses 55, wherein the aberration wavefront is represented by Zernike polynomials.

57. The method of clause 56, wherein the Zernike polynomials are weighted according to a correction potential of the patterning apparatus.

58. The method of any of clauses 56-57, wherein the determining of the lens actuator setting comprises:

reducing weight of one or more Zernike polynomials associated with relatively higher aberration content.

59. The method of any of clauses 56-58, wherein the determining the lens actuator setting comprises:

determining a sub-set of the lens actuator space to balance scanner aberrations due to lens fingerprint, and/or mirror heating, wherein the balancing is based on adjusting weights of the Zernike polynomials.

60. The method of any of clauses 48-59, wherein the lithographic metric represents a physical quantity associated with a pattern imaged, via the patterning apparatus, on a substrate.

61. The method of clause 60, wherein the lithographic metric represents at least one of the following physical quantity:

a pattern shift associated with a printed pattern with respect to a desired position of a desired pattern, a focus shift of the patterning apparatus with respect to the substrate, the focus shift containing astigmatism offset associated with the patterning apparatus, an asymmetry in critical dimension at a top and a bottom of the printed pattern, or an edge placement error associated with the printed pattern.

62. The method of any of clauses 48-61, wherein the lens actuator setting comprises values associated with an offset, a tilt, a curvature, and/or up to and including $3^{rd}$ order parameters or higher than $3^{rd}$ order associated with Zernike polynomials.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A computer readable non-transitory storage medium comprising instructions, the instructions, when executed by a computer system, configured to cause the computer system to at least:

obtain (i) a reference performance of a reference apparatus, (ii) a lens model for a patterning apparatus configured to convert a wavefront parameter of a wavefront to actuator movement, and (iii) a lens fingerprint of a tuning apparatus; and determine the wavefront parameter based on the lens fingerprint, the lens model, and a cost function, wherein the cost function comprises a difference between the reference performance and a tuning apparatus performance.

2. The medium of claim 1, wherein the instructions configured to cause the computer system to determine the wavefront parameter are configured to do so in an iterative process, an iteration comprising:

generation, via simulation with the lens model using the lens fingerprint of the tuning apparatus, of an initial wavefront;

determination of a substrate pattern from the initial wavefront;

determination of the tuning apparatus performance from the substrate pattern;

evaluation of the cost function based on the tuning apparatus performance and the reference performance; and adjustment of the wavefront parameter of the initial wavefront based on a gradient of the cost function, such that the cost function is improved.

3. The medium of claim 2, wherein the adjustment of the wavefront parameter is further based on a performance fingerprint of the lens model.

4. The medium of claim 2, wherein the determination of the substrate pattern comprises simulation with a process model of the patterning process using the initial wavefront or the adjusted wavefront parameter-.

5. The medium of claim 2, wherein the determination of the substrate pattern comprises:

receipt, via a metrology tool, of substrate measurements of an exposed substrate, wherein the substrate is exposed using the initial wavefront or the adjusted wavefront parameter; and determination of the substrate pattern based on contour extraction from the substrate measurement.

6. The medium of claim 1, wherein the wavefront parameter comprises the lens fingerprint of the tuning apparatus and a performance fingerprint of the lens model.

7. The medium of claim 1, wherein the cost function is minimized or maximized.

8. The medium of claim 1, wherein the cost function represents an edge placement error, CD and/or an error within a tolerance band of edge placement.

9. The medium of claim 1, wherein the lens model includes constraints related to a correction limitation of an apparatus corresponding to the wavefront parameter.

10. The medium of claim 1, wherein the wavefront parameter comprises an offset, a tilt, a curvature, and/or up to third order parameter associated with an optical system of the patterning apparatus.

11. The medium of claim 1, wherein the wavefront is a through-slit wavefront.

12. The medium of claim 11, wherein the slit has a rectangular shape.

13. The medium of claim 1, wherein the wavefront is represented by a Zernike polynomial across a slit.

14. The medium of claim 13, wherein the wavefront parameter is expressed as a vector of Zernike coefficients.

15. The medium of claim 1, wherein the instructions are further configured to cause the computer system to:

convert, via the lens model, the wavefront parameter to the actuator movement; and actuate the optical system of the tuning apparatus based on the actuator movement.

16. A computer readable non-transitory storage medium comprising instructions, the instructions, when executed by a computer system, configured to cause the computer system to at least:

obtain (i) a reference performance of a reference apparatus corresponding to a reference lens fingerprint, and (ii) a lens fingerprint of a tuning apparatus; and determine a wavefront parameter of the tuning apparatus based on the lens fingerprint and a cost function, wherein the cost function computes a difference between the reference performance and a tuning apparatus performance.

17. The medium of claim 16, wherein the instructions configured to cause the computer system to obtain the reference performance are further configured to cause the computer system to:

obtain a measurement of the reference lens fingerprint of the reference apparatus;

generate, via simulation with a process model, a reference pattern based on the measured reference lens fingerprint and a patterning device pattern corresponding to a design layout; and determine the reference performance based on a contour of the reference pattern.

18. The medium of claim 16, wherein the instructions configured to cause the computer system to determine the wavefront parameter are configured to do so in an iterative process, an iteration comprising:

determination via simulation with a process model, a substrate pattern using a patterning device pattern and a lens fingerprint of the tuning apparatus;

determination of the tuning apparatus performance based on the substrate pattern;

evaluation of the cost function based on the tuning apparatus performance and the reference performance; and adjustment of the wavefront parameter based on a gradient of the cost function with respect to the wavefront parameter, such that the cost function is improved.

19. The medium of claim 18, wherein the patterning device pattern is generated via simulation of a mask optimization or source mask optimization process, wherein a lens aberration model is included in the process model.

20. A computer readable non-transitory storage medium comprising instructions, the instructions, when executed by a computer system, configured to cause the computer system to at least:

obtain (i) a plurality of hot spot patterns corresponding to a layer of a substrate, (ii) a plurality of wavefronts corresponding to the plurality of hot spot patterns, and (iii) a lens fingerprint of a tuning apparatus;

determine, via simulation of a patterning process using the lens fingerprint, a tuning apparatus performance; and select a wavefront parameter for the tuning apparatus from the plurality of wavefronts based on comparison between the tuning apparatus performance and a reference performance.

* * * * *